(12) United States Patent
Hewitt

(10) Patent No.: US 6,526,538 B1
(45) Date of Patent: Feb. 25, 2003

(54) TURBO PRODUCT CODE DECODER

(75) Inventor: Eric Hewitt, Pullman, WA (US)

(73) Assignee: Comtech Telecommunications Corp., Melville, NY (US)

( * ) Notice: Subject to any disclaimer, the term of this patent is extended or adjusted under 35 U.S.C. 154(b) by 0 days.

(21) Appl. No.: 09/406,252

(22) Filed: Sep. 27, 1999

Related U.S. Application Data

(60) Provisional application No. 60/102,168, filed on Sep. 28, 1998.

(51) Int. Cl.$^7$ .............................................. H03M 13/00

(52) U.S. Cl. ........................ 714/780; 375/262; 714/777

(58) Field of Search ................................ 714/752, 755, 714/780, 783, 774, 777, 782, 793; 370/203; 375/346, 262, 265, 263, 376, 377, 332, 340; 704/222, 242

(56) References Cited

U.S. PATENT DOCUMENTS

| | | | |
|---|---|---|---|
| 4,845,714 A | 7/1989 | Zook ........................... | 714/755 |
| 5,406,570 A | 4/1995 | Berrou et al. ............... | 714/792 |
| 5,446,747 A | 8/1995 | Berrou et al. ............... | 714/788 |
| 5,499,254 A | 3/1996 | Ikekawa et al. ............ | 714/794 |
| 5,541,955 A | * 7/1996 | Jacobsmeyer ................ | 375/222 |

(List continued on next page.)

FOREIGN PATENT DOCUMENTS

| | | | | |
|---|---|---|---|---|
| EP | 0 625 829 A2 | 11/1994 | .......... | H03M/13/00 |
| EP | 0 625 829 | * 11/1994 | .......... | H03M/13/00 |
| FR | 2 778 289 | 11/1999 | .......... | H03M/13/00 |
| WO | WO 00/19616 | 4/2000 | .......... | H03M/13/00 |

OTHER PUBLICATIONS

Picart et al. (Performance of Turbo–Decoded Product codes used in Multilevel Coding; IEEE, Apr. 1996).*
Goalic et al. (Real–Time Turbo–Decoding of Product Codes on a Digital Signal Processor; IEEE, Aug. 1997).*

(List continued on next page.)

Primary Examiner—Albert Decady
Assistant Examiner—Guy Lamarre
(74) Attorney, Agent, or Firm—Haverstock & Owens LLP

(57) ABSTRACT

The present invention is a turbo product code decoder capable of decoding multi-dimensional coding schemes. The decoder may be implemented in any digital communication system capable of receiving an encoded stream of data. The decoder is configured for receiving soft decision values. The decoder iteratively decodes the data by generating new soft difference values for each axis-iteration of decoding. These soft difference values represent the change in soft decision values after each axis-iteration. The soft difference values from each axis-iteration are then summed with the original soft decision values in decoding each of the other axis. After any full iteration—i.e. after all axis dimensions have been decoded one full time, the previous difference values for any axis are discarded when that axis is decoded in subsequent iterations. Accordingly, the same information is not continuously fed into the decoder during each subsequent iteration, thereby decreasing the likelihood of error and offering an improvement over prior decoders. Moreover, using unique nearest neighbor computation logic, the decoder of the present invention is able to generate valid nearest neighbors more efficiently without requiring the use of a look-up table, thereby reducing the amount of time required to decode. Finally, the decoder of the present invention utilizes four decoders arranged in parallel along with a unique memory array accessing scheme such that multiple rows or columns may be decoded at the same time, thereby increasing the data throughput time of the decoder over prior turbo product code decoders.

30 Claims, 8 Drawing Sheets

U.S. PATENT DOCUMENTS

| | | | |
|---|---|---|---|
| 5,563,897 A | 10/1996 | Pyndiah et al. | 714/755 |
| 5,684,811 A | 11/1997 | Doran | 714/792 |
| 5,703,911 A | 12/1997 | Lin et al. | 375/341 |
| 5,719,884 A | 2/1998 | Roth et al. | 714/755 |
| 5,721,745 A | 2/1998 | Hladik et al. | 714/755 |
| 5,721,746 A | 2/1998 | Hladik et al. | 714/792 |
| 5,729,560 A | 3/1998 | Hagenauer et al. | 714/786 |
| 5,761,248 A | 6/1998 | Hagenauer et al. | 375/340 |
| 5,787,127 A | 7/1998 | Ono et al. | 375/341 |
| 5,787,239 A | 7/1998 | Horie et al. | 395/114 |
| 5,802,116 A | 9/1998 | Baker et al. | 375/341 |
| 5,841,818 A | 11/1998 | Lin et al. | 375/341 |
| 5,901,182 A | 5/1999 | Kot | 375/341 |
| 5,907,582 A | 5/1999 | Yi | 375/259 |
| 5,930,272 A | 7/1999 | Thesling | 375/262 |
| 6,065,147 A | 5/2000 | Pyndiah et al. | 714/755 |
| 6,104,758 A * | 8/2000 | Kaku et al. | 375/265 |
| 6,122,763 A | 9/2000 | Pyndiah et al. | 714/755 |

OTHER PUBLICATIONS

NN9405101(Single–Bit Correct, Double–Bit Detect Error Checking/Correction Scheme; IBM Technical Disclosure Bulletin, May 1994; US; vol. No.: 37, p. No.: 101–104).*

NA891026(Diagnosing On–Card Error Checking and Correcting Operations Using Latched Syndrome Data;; IBM Technical Disclosure Bulletin, Oct. 1989, US; vol. No.: 32, p. No.: 26–29).*

Patrick Adde, et al. "Design and Performance of a Product Code Turbo Encoding–Decoding Protoype" pp. 214–219.

Annie Cart, et al. "Performance of Turbo–Decoded Product Codes Used in Multilevel Coding" IEEE 1996, pp. 107–111.

Andre Goalic, et al. "Real–Time Turbo–Decoding of Product Codes on a Digital Signal Processor" Publication Date: Mar. 11, 1997, pp. 624–628.

"Error–Free Coding", Peter Elias, IRE Transactions on Information Theory, 1954, pp. 29–37.

"Random Error and Burst Correction–by Iterated Codes", Sudhakar Reddy, John Robinson, IEEE, 1970, pp. 182–185.

"A Class of Algorithms for Decoding Block Codes with Channel Measurement Information", David Chase, IEEE, 1971, pp. 170–181.

L. Tolhuizen et al., "Union bounds on the performance of product codes," ISIT 1998, p. 267.

L. Tolhuizen & C.P.M.G. Baggen, "On the weight enumerator of product codes," Discrete Mathematics, 1992, vol. 106, No. 107 pp. 483–488.

F. Chiaraluce & R. Garello, "On the Asymptotic Performance of Hamming Product Codes", ISCTA 01, pp. 1–6, Jul. 15, 2001.

H. Nickl,et al., "Approaching Shannon's capacity limit by 0.27 dB using Hamming codes in a 'turbo'–decoding scheme," ISIT 1997.

J. Lodge et al., "Separable Map "Filters" For The–Decoding Of Product and Concatenated Codes," IEEE, 1993, pp. 1740–1745.

J. Hagenauer & P. Hoeher, "A Viterbi Algorithm with Soft–Decision Outputs and its Applications," IEEE, 1989, pp. 1680–1686.

S. Hirasawa et al., "Modified Product Codes," IEEE 1984, vol. IT–30, No. 2, pp. 299–306.

G. Ungerboeck, "Channel Coding with Multilevel/Phase Signals," IEEE Transactions on Information Theory vol. IT–28, No. 1, Jan. 1982.

S. Cambanis & M. Habib, "Finite Sampling Approximations for non–Band–Limited Signals," IEEE, vol. 25, No. 5, Jul., 1981 p. 67.

U. Wachsmann et al., "Multilevel Codes: Theoretical Concepts and Practical Design Rules," IEEE, vol. 25, No. 5, Jul. 1999, pp. 1361–1391.

G. Caire et al., "Bit–Interleaved Coded Modulation," IEEE, vol. 44, No. 3 May 1998, pp. 927–945.

O. Acikel & W. Ryan, "High Rate Turbo Codes for BPSK/QPSK Channels," IEEE, 1998, pp. 422–427.

W. Blackert & S. Wilson, "Turbo Trellis Coded Modulation," University of Virginia[undated][no page numbers].

J. Hagenauer, P. Hoeher, "Algorithm with Soft–Decision Outputs and its Applications," IEEE 1989 pp. 1680–1686.

C. Berrou, "Near Optimum Error Correcting Coding and Decoding: Turbo–Codes," IEEE, vol. 44, No. 10, Oct. 1996, pp. 1261–1271.

"Performance of Block Turbo Coded 16–QAM and 64–QAM Modulations," R. Pyndiah, A. Picart, and A. Glavieux, IEEE, 1995, pp. 1039–1043.

"Performance of Turbo–Decoded Product Codes Used in Multilevel Coding," A. Picart and R. Pyndiah, IEEE, 1996, pp. 107–111.

"Near–Optimum Decoding of Product Codes: Block Turbo Codes," R. Pyndiah, IEEE Transactions on Communications, vol. 46, No. 8, Aug. 1998, pp. 1003–1010.

"Frequency–Efficient Coding with Low–Density Generator Matrices," J. Cheng and R. McEliece, Aug. 1997 draft, (presented in part: Oct. 1996 at 34th Allerton Conference on Communications, Control, and Computing, Monticello, Illinois; and 1997 IEEE International Symposium on Information Theory, Ulm, Germany, Jul. 1997), pp. 1–30.

"Code Performance as a Function of Block Size," S. Dolinar, D. Divsalar, and F. Pollara, TMO Progress Report 42–133, May 1998, pp. 1–23..

"Multiple Turbo Codes for Deep–Space Communications," D. Divsalar and F. Pollara, TDA Progress Report 42–121, May 1995, pp. 66–77.

"Turbo Codes for Deep–Space Communications," D. Divsalar and F. Pollara, TDA Progress Report 42–120, Feb. 1995, pp. 29–39.

"On the Design of Turbo Codes," D. Divsalar and F. Pollara, TDA, Progress Report 42–123, Nov. 1995, pp. 99–121.

"Pseudo–Random Recursive Convolutional Coding For Near–Capacity Performance," G. Battail, C. Berrou, and A. Glavieux, IEEE, 1993, pp. 23–27.

"Decoding Via Cross–Entropy Minimization," M. Moher, IEEE, 1993, pp. 809–813.

"Soft–Output Decoding Algorithms for Continuous Decoding of Parallel Concatenated Convolutional Codes," S. Benedetto, D. Divsalar, G. Montorsi, and F. Pollara, IEEE, 1996, pp. 112–117.

"Advances in Soft–Output Decoding," P. Hoeher, IEEE, 1993, pp. 793–797.

"A Low Complexity Soft–Output Viterbi Decoder Architecture," C. Berrou, P. Adde, E. Angel and S. Faudeil, IEEE, 1993, pp. 737–740.

"Decoding of Binary Codes with Analog Networks," J. Hagenauer, ITW, Feb. 1998, pp. 13–14.

"On Post–Decision Symbol–Reliability Generation," N. Seshadri and P. Hoeher, IEEE, 1993, pp. 741–745.

"The Effect of Turbo Codes on Figure 1," D. Costello and H. Cabral, ITW, Feb. 1998, pp. 41–42.

"Turbo Codes for PCS Applications," D. Divsalar and F. Pollara (no date or publisher listed).

"An IC for Turbo–Codes Encoding and Decoding," C. Berrou, P. Combelles, P. Penard, and B. Talibart, IEEE, 1995, pp. 90–91.

"Perspectives on Interleaved Concatenated Codes with Iterative Soft–Output Decoding," A. J. Viterbi, A. M. Viterbi, J. Nicolas, and N. Sindhushayana, International Symposium on Turbo Codes, 1997, pp. 47–54.

"Asymptotic Performances of Nonrepetitive and Repetitive Turbo Codes," C. Wang, IEEE, 1997, pp. 1–6.

"Hyper–Codes: High–Performance Low–Complexity Error–Correcting Codes," A. Hunt and S Crozier (no date or publisher listed).

"On the Performance of Turbo Codes," C. Wang, IEEE, 1998, pp. 987–992.

"Analysis, Design, and Iterative Decoding of Double Serially Concatenated Codes with Interleavers," IEEE Journal on Selected Areas in Communications, vol. 16, No. 2, Feb. 1998, pp. 231–244.

"Punctured Turbo Codes for BPSK/QPSK Channels," O. Acikel and W. Ryan, (no publisher listed), Mar. 1999, pp. 1–30.

"Implementation Issues for High Rate Turbo Codes on BPSK/QPSK Channels," O. Acikel, (no publisher listed), Mar. 1999, pp. 1–12.

"Iterative Decoding of Binary Block and Convolutional Codes," J. Hagenauer, IEEE Transactions on Information Theory, vol. 42, No. 2, Mar. 1996, pp. 429–445.

"Optimal Decoding of Linear Codes for Minimizing Symbol Error Rate," L. Bahl, J. Cocke, F. Jelinek, and J. Raviv, IEEE Transactions on Information Theory, Mar. 1974, pp. 284–287.

* cited by examiner

| G0 4 SOFT VALUE WORD | G1 4 SOFT VALUE WORD | G2 4 SOFT VALUE WORD | G3 4 SOFT VALUE WORD |
|---|---|---|---|
| G4 4 SOFT VALUE WORD | G5 4 SOFT VALUE WORD | G6 4 SOFT VALUE WORD | G7 4 SOFT VALUE WORD |
| G8 4 SOFT VALUE WORD | G9 4 SOFT VALUE WORD | G10 4 SOFT VALUE WORD | G11 4 SOFT VALUE WORD |
| G12 4 SOFT VALUE WORD | G13 4 SOFT VALUE WORD | G14 4 SOFT VALUE WORD | G15 4 SOFT VALUE WORD |
| G16 4 SOFT VALUE WORD | G17 4 SOFT VALUE WORD | G18 4 SOFT VALUE WORD | G19 4 SOFT VALUE WORD |

Fig. 7

TURBO PRODUCT CODE DECODER

This application claims benefit to U.S. provisional application Serial No. 60/102,168, filed Sep. 28, 1998.

FIELD OF THE INVENTION

The invention generally relates to the field of linear block codes. More particularly, the invention relates to a soft decision turbo product code decoder for error correction decoding.

BACKGROUND OF THE INVENTION

Recently, error correction decoding techniques for recognizing and correcting errors in digital signal transmission have been used in many fields to improve the reliability of data transmission. One such technique is known as Error Corrective Coding (ECC). The basic concept of ECC is to add redundant bits to a digital message in order to eliminate the need for retransmission of the data. This addition of redundant bits to the message is known as Forward Error Correction (FEC). The addition of these redundancy bits allows a decoder at the receiving end to detect and/or correct errors that might have been caused during transmission.

There are several methods employed in adding redundant bits to a message, and one such method is known as block coding. In block coding, the data or message to be transmitted is broken into smaller blocks and each block is coded separately—i.e. redundant bits are appended to the end of each block of data. On the receiving end, each block of data is decoded separately. Block coding has been used in many practical applications, including magnetic and optical storage systems, as well as mobile communications systems, such as cellular phones. Familiarity with the terminology used in block coding is important in understanding the present invention. In preparation for the description contained herein, the basic principles and terminology behind block coding shall be briefly described.

A block code is often described as an (n,k) code, wherein n is the total number of bits in the encoded transmission block and k is the number of bits in the unencoded message block. Accordingly (n−k) redundancy bits, also known as parity bits, have been added to the message block when it is encoded before transmission. In a block code, every legitimate unencoded message differs from every other legitimate unencoded message by a minimum number of bit positions. We refer to this number of bit positions by which every legitimate unencoded message differs as the Hamming distance $d_{min}$. In order to correct single bit errors, a block code must have a minimum Hamming distance of at least 3.

Binary Hamming codes are a well known family of codes used in the art of error correction which provide FEC by using a "block parity" mechanism, wherein a number of redundancy or parity bits are appended to each block of data before transmission. The number of parity bits required to be appended for a given block is defined as the Hamming rule, and is a function of the total number of bits which may transferred—i.e. the bandwidth. A code obtained by appending an (even) extended parity bit onto a binary Hamming code is called an extended Hamming code.

Product codes arrange two dimensional codes (n,k) into (n×n) size arrays. First, k blocks of data, with each block being a length k, are stored in a (k×k) array. Each row and column is then encoded with redundancy bits or ECC and the (even) extended parity bit is appended to each row and column, thereby creating an Extended Hamming Product code For example, the following diagram shows an (8,4)× (8,4) Extended Hamming Product Code, where "D" represents original data, "E" represents the ECC or redundancy bits, and "P" represents the extended parity bit.

| D | D | D | D | E | E | E | P |
|---|---|---|---|---|---|---|---|
| D | D | D | D | E | E | E | P |
| D | D | D | D | E | E | E | P |
| D | D | D | D | E | E | E | P |
| E | E | E | E | E | E | E | P |
| E | E | E | E | E | E | E | P |
| E | E | E | E | E | E | E | P |
| P | P | P | P | P | P | P | P |

As can be seen, each row and column ends with a parity bit P.

The conventional method for decoding an Extended Product Hamming Code after transmission is to receive incoming data, store it in an array and decode each row or column of the array separately using maximum likelihood decoding. Typically, this is accomplished through the use of a look-up table which includes every legitimate valid message. In the decoding process, the data is compared to each entry in the look-up table—i.e. all of the possible valid messages within the table, after the parity and redundancy bits have been removed. If the Hamming distance $d_{min}$ is large, than the likelihood of error in choosing the right message from the table is reduced. However, if the Hamming distance $d_{min}$ is small, then the likelihood of error increases. Full correlation decoding of one row or column in a product code requires comparing the data with the full set of possible transmitted codewords. For an (8,4) code, this only requires a comparison with 16 possible transmitted codewords. However, for a (64, 57) code, there are $1.4 \times 10^{17}$ possible transmitted codewords, making a full correlation with the use of a look-up table unfeasible.

Additionally, error correction decoding techniques acquire increased value when they not only accurately estimate the content of the original message; but, also provide confidence measures as to the likelihood that the decoded message is correct. Such information is generally referred to as "soft output information". As an example, in a soft output decoder, the decoder will receive an incoming block of data and attempt to decode the incoming block of data. After decoding the incoming block of data, the soft output decoder will assign a confidence value or measure to the output, indicating whether the decoder is. more or less certain of the results. If the decoder assigns a high confidence value to the output, it is more certain that is has properly decoded the incoming block of data. However, if the decoder assigns a low confidence value to the output, it is less certain that the incoming block of data has been properly decoded—i.e. there may be more than one possible interpretation of the incoming block of data.

A Soft In/Soft Out (SISO) decoder receives demodulated soft decision input data and produces soft decision output data. For each bit in the block of soft decision input data, the decoder examines the confidence of the other bits in the block, and using the redundancy of the code, generates a new soft decision output for the given bit. If the redundancy of the code indicates that the output for the given bit is correct, the decoder will output a positive confidence value. If the redundancy of the decode indicates that the output for the given bit is incorrect, it will output a negative confidence value. The negative value indicates that the confidence value for that bit should be decreased. This may mean that the bit should be inverted from a "1" to a "0" or vice versa.

Within the last decade, SISO decoders have been applied to a new decoding method called turbo codes. Turbo codes are an iterative decoding scheme which decode incoming data blocks in two or more dimensions (depending on the encoding scheme). Accordingly, by way of example, incoming data may be stored in an array and decoded by row and column. When the iterative decoding is applied to product codes of extended Hamming Codes the resultant code is called a turbo product code. A conventional turbo product decoder feeds demodulated soft decision data into the SISO for the first dimension (i.e. the x-rows). The output is then summed with the original demodulated soft decision data and fed back into the SISO for decoding of the second dimension (i.e. the y-columns). The output from the SISO is again summed with the original demodulated soft decision data and fed back into the SISO for decoding of the first dimension once again (i.e. the x-rows). In order for this iterative decoding process to be effective, the data must have been encoded in at least two different dimensions (i.e. it was stored in an array and the rows and columns of the array were each encoded). Typically, this is done by encoding the data horizontally (rows) and vertically (columns).

Typically, each iteration in the decoding process modifies the confidence or soft decision value assigned to each bit since the data is slightly modified through each horizontal and/or vertical decode iteration. This is usually done by generating a new confidence or soft decision value after each iteration. Eventually, the confidence or soft decision value will be pushed higher or lower until a hard decision value (bit value of 0 or 1) can be reached. This iterative process continues until a hard decision value for each bit is reached.

It is understood that when decoding in more than two dimensions, each dimension may be decoded using a different decoding scheme or algorithm (i.e. the rows and columns may not have necessarily been encoded using the same encoding scheme and, accordingly, a different decoding scheme may be used for decoding rows versus decoding columns). Moreover, if decoding in more than two dimensions, then each axis or dimension will be fully decoded before beginning again with the first axis (i.e. all x-rows will be decoded, then all y-columns will be decoded and, finally, all z-columns must be decoded before beginning the second full iteration). Thus, for example, when decoding a three dimensional scheme with an x-axis, a y-axis and a z-axis, the x-axis is first decoded. The results from the x-axis decoding are then summed with the original demodulated soft decision data and fed back into the decoder for decoding of the y-axis. The results from the y-axis decoding are then summed with the results from the x-axis and the original demodulated soft decision data, and the result if fed back into the decoder for decoding of the z-axis. Finally, after the z-axis has been decoded, the results from the z-axis decoding, the previous y-axis decoding results, the previous x-axis decoding results, and the original demodulated soft decision data are summed and the resultant is fed back into the decoder for decoding along the x-axis for a second iteration. Thus, between decoding of each axis the results for all previous decoding in other dimensions will be summed with the original demodulated soft decision data.

One problem which exists with this prior art technique is the recurring use of the original demodulated soft decision data. The fundamental principle for iterative decoding feedback is to avoid feedback which includes information which stems from the input. This is important because the error of any decoder will be highly correlated between future iterations if the feedback includes information which stems from the input. This prior art technique for turbo decoding continuously sums the output from each previous iteration with the original demodulated soft decision data, thereby increasing the likelihood of error in subsequent iterations. Accordingly, what is needed is a turbo decoding scheme which does not rely upon the previous iteration results in subsequent iterations.

Additionally, much like the product coding scheme described earlier, conventional turbo coding/decoding techniques rely heavily upon the use of look-up tables in order to generate valid "nearest neighbors" and assign soft decision values. Once again, full correlation decoding of each axis requires comparing the received soft decision data with the full set of possible transmitted codewords. As explained earlier, there are $2^k$ possible codewords transmitted for an (n, k) code. Accordingly, in order to fully decode an (8,4) code, each individual axis would require a comparison with only sixteen transmitted codewords. However, for a (64,57) code, there are $1.4 \times 10^{17}$ possible transmitted codewords, making a full comparison with each possible codeword unfeasible. Some prior art decoders reduce the size of the look-up table but require a k×k size table. Accordingly, what is further needed is a decoding scheme which does not require the use of look-up tables to find the valid "nearest neighbor" and assign soft decision values.

SUMMARY OF THE INVENTION

The turbo product code decoder of the present invention generates soft difference values, instead of new confidence values, in order to improve performance. The difference between prior art decoders and the present invention lies in the fact that these soft difference values have the soft decision value of the input subtracted from the confidence value output. After any full iteration—i.e. after all axis (x, y and z) dimensions have been decoded, the previous difference value for any axis is discarded when that axis is decoded in subsequent iterations. Accordingly, the same information is not continuously fed into the decoder during each subsequent iteration, thereby decreasing the likelihood of error and offering an improvement over prior art decoders.

Moreover, using unique nearest neighbor computation logic, the turbo product code decoder of the present invention is able to generate valid nearest neighbors more efficiently without requiring the use of a look-up table, thereby reducing the design size. Finally, the turbo product code decoder of the present invention utilizes four decoders arranged in parallel along with a unique array accessing scheme such that multiple rows or columns may be decoded at the same time, thereby increasing the data throughput time of the turbo product code decoder of the present invention over prior art turbo product code decoders.

The present invention is a turbo product code decoder capable of decoding multi-dimensional coding schemes. The turbo product code decoder of the present invention may be implemented in any digital communication system capable of receiving an encoded stream of data. The digital communication system will preferably include a conventional demodulator which receives the encoded stream of data, demodulates the encoded stream of data and generates an initial soft decision value for each bit in the encoded stream of data. This initial soft decision value may be in a signed or unsigned 2's complement notation, with the sign (+) or (−) representing a determination as to whether the bit is a binary "1" or "0" and the numerical value representing an initial confidence level in such determination. These initial soft decision values are then output from the demodulator and fed into the turbo product code decoder of t he present invention.

When decoding a two dimensionally encoded scheme—i.e. a stream of data which has an x-axis coding and a y-axis coding, the initial soft decision values are transmitted from the conventional demodulator to the turbo product code decoder of the present invention, where they are preferably deinterleaved and arranged into four soft value words which are stored in a two dimensional original memory array of x-rows and y-columns. The original memory array is preferably arranged in four $n_y$ rows each having $n_x/4$ words per row, where $n_x$ and $n_y$ are the length of the x and y axes, respectively. The initial soft decision values are stored in the original memory array in four soft value words with each individual soft decision value being stored in the signed or unsigned two's complement notation. As explained above, the absolute or numerical value represents an initial confidence level for each bit in the four vectors and the sign (+) or (−) represents an initial hard decision bit value determination as to whether the bit is a binary "1" or a binary "0", wherein a (+) sign represents a bit value of "1" and a (−) sign represents a bit value of "0".

The initial soft decision values in the x-rows of the original memory array, which represent the x-axis coding, are then read from the array into a SISO group which includes four separate SISO decoders arranged in parallel. These values are read from the original memory array on a row by row basis using a unique accessing scheme. This unique accessing scheme shall be described in greater detail; but, for now, it is understood that the initial soft decision values are accessed from the original memory array on a row by row basis such that four rows or column vectors can be decoded in parallel using the four SISO decoders—with each SISO decoding row or column vector.

These four SISO decoders utilize improved nearest neighbor computation logic to generate nearest neighbors for the four vectors in the codeword without using look-up tables. The "closest" nearest neighbor is then selected by calculating a difference metric for each nearest neighbor and selecting the nearest neighbor having the lowest difference metric. Each bit in the "closest" nearest neighbor is then assigned a "difference" value which is based upon a numerical difference between a new confidence value calculated for that bit and the confidence value assigned to the bit in the same position in the incoming vector.

After all four rows have been decoded—i.e. after a new difference value has been assigned to each bit in the "closest" nearest neighbor, four entire vectors are generated with new difference values in each bit position. Each difference value is then multiplied by an x-axis feedback constant and the entire four rows are then stored by the data multiplexer in a temporary difference array. Each bit in the four output vector is stored in signed or unsigned two's complement notation, with the numerical value in each bit position representing the change in confidence level and the sign (+) or (−) representing the degree of change. This process is repeated for all rows in the product code.

The information in the temporary difference array is then summed with the initial soft decision values which are stored in columns of the original memory array, thereby generating new input data which is then fed back into the SISO group for decoding by the four SISO decoders. Once again this is done using a unique accessing scheme which shall be discussed in greater detail herein; but, for now, it is understood that the initial soft decision values stored in the columns (the y-axis data) of the original memory array is read on a column by column basis where is summed with the information in the temporary difference array. Using this new input data, the y-axis data is decoded.

Once again, the four SISO decoders are used to generate nearest neighbors and the "closest" nearest neighbor is again selected. Each bit in the closest nearest neighbor is then assigned a difference value based upon a difference between a new confidence value assigned to the bit and the confidence value of the bit in the same position in the new input data. Four new vectors are generated and each difference value in each output vector is multiplied by a y-axis feedback constant. The new output vectors are stored in the temporary difference array, overwriting the difference values for the output vector from the decoding of the rows which were previously stored after the x-axis iteration. This process is repeated for all columns in the product code.

The information in the temporary difference array is once again summed with the initial soft decision values stored in the rows of the original memory array (the x-axis data), and the result is fed back into SISO group on a row by row basis. This iterative process of decoding rows (x-axis), then columns (y-axis) and then rows (x-axis) is repeated between the rows (x-axis) and columns (y-axis), for k full iterations, wherein a full iteration represents a single pass through the decoder of both the x-axis (rows) and y-axis (columns).

After the final full iteration, the difference values in the new output vectors for the y-axis are multiplied by the y-axis feedback constant and, instead of being stored in the temporary difference array, these values are then summed with the information stored in the difference array (which should be the difference values from the previous x-axis iteration) and the initial soft decision values stored in the original memory array (original x-axis and y-axis data) in order to generate final output values. These final output values will be in a signed two's compliment notation, with the sign representing the actual binary bit value of "1" or "0" and the numerical value representing a final confidence level. These final output values are then converted into a decoded output data stream of binary "1's" and "0's".

The turbo product code decoder of the present invention can also be used to decoded data streams which have been encoded with three dimensional coding schemes or higher. For example, when decoding a three dimensional code, the initial soft decision values are transmitted from the conventional demodulator to the turbo product code decoder of the present invention, where they are deinterleaved and stored in the original memory array, with $n_y$ times $n_z$ rows with each row containing $n_x/4$ words.

The decoding process proceeds in much the same way as a two dimensional scheme; however, when decoding a three dimensional code, the output from the two previous axis iterations are each stored in separate difference arrays and then summed with the initial soft decision data in order to generate the input for each subsequent iteration. For example, on the first iteration of decoding the x-axis, the output difference values will be multiplied by an x-axis feedback constant and stored in a first difference array. The information in the first difference array will then be summed with the initial soft decision values in the y-columns of the original memory array in order to generate the input values used for the y-axis iteration, and the y-axis iteration will begin.

Upon completion of the y-axis iteration, the output difference values which result from decoding the y-axis will be multiplied by a y-axis feedback constant and stored in a second difference array. Then, the information from the first difference array (the x-axis iteration difference values), the information in the second difference array (the y-axis iteration difference values), and the original incoming data will then all be summed in order to generate the input for the z-axis iteration. Once the z-axis has been decoded, the output from the z-axis iteration will be multiplied by a z-axis feedback constant and stored in the first difference array, overwriting the output from the prior x-axis iteration which was previously stored in the first difference array.

Subsequently, the information from the first difference array (the z-axis iteration results) and the second difference array (the y-axis iteration results) will then be summed with the original incoming data for the x-axis (which is stored in the first sixteen rows of the original memory array) in order to generate the input for the second x-axis iteration. Once the x-axis has been fully decoded for a second iteration, the output difference values are once again multiplied by the x-axis feedback constant and this time stored in the second difference array, overwriting the output from the previous y-axis iteration.

This process of iteratively decoding each axis continues with the output difference values from the SISO group being multiplied by the appropriate feedback constant and written, alternately, to the first and second difference arrays, such that as each axis is decoded, the previous results from the iterations of the other two axes are stored in the difference arrays.

The decoder can run a pre-programmed number of iterations, or it can determine when the decoding operation is completed using a stop iteration criteria. Using the status from each SISO, the decoder can determine that future iterations will not further modify the data. At this point, it completes one final iteration to sum all axes differences values with the initial soft decision values and generates a hard decision output.

After the final full iteration, when all axis (x, y and z) have been decoded, the output difference values from the final z-axis iteration are multiplied by the z-axis feedback constant and summed with the previous x-axis iteration difference values (which should still be stored in the first difference array), the previous y-axis difference values (which should still be stored in the second difference array) and the initial soft decision values stored in the original memory array, thereby generating final output values. These final output values will be in a signed two's compliment notation, with the sign representing the actual binary bit value of "1" or "0" and the numerical value representing a final confidence level. These final output values are then converted into a decoded output data stream of binary "1's" and "0's".

BRIEF DESCRIPTION OF THE DRAWINGS

FIG. 7 shows a 2-dimensional memory array for implementation within the present invention.

DETAILED DESCRIPTION OF PREFERRED EMBODIMENT

The turbo product code decoder of the present invention includes a SISO group having four separate SISO decoders arranged in parallel, an original memory array, at least one difference array, and a data multiplexer. In the preferred embodiment, the turbo product code decoder of the present invention can be used to decode two or three dimensional codes with axes of variable length. It will be apparent to one of ordinary skill in the art that codes of even more dimensions can be handled according to the teachings of the present invention.

In operation, the turbo product code decoder of the present invention is implemented in any digital communication system capable of receiving an encoded bit stream. The digital communication system will preferably include a conventional demodulator which receives the encoded bit stream, demodulates the encoded bit stream and generates an initial soft decision value for each bit in the encoded bit stream. This initial soft decision value may be in a signed or unsigned 2's complement notation, with the sign (+) or (−) representing a determination as to whether the bit is a binary "1" or "0" and the absolute numerical value representing an initial confidence level in such determination. These initial soft decision values are then output from the demodulator and fed into the turbo product code decoder of the present invention.

The turbo product code decoder receives these initial soft decision values, deinterleaves them and stores them in an original memory array in groups of soft decision values or words. Preferably, these words are four values in length. Once all of the initial soft decision values for a block have been stored in the original memory, the SISO group begins the actual decoding process through an iterative decoding scheme. The number of iterations is fully programmable. Using unique nearest neighbor computation logic in order to facilitate the iterative decoding scheme, the SISO group is able to generate nearest neighbor codewords without the use of a lookup table, choose the "closest" nearest neighbor and generate an output codeword having soft differences value for each bit in the codeword, wherein these soft difference values represent a difference in soft decision confidence values for each bit per iteration. After each axis iteration, these soft difference values are multiplied by a feedback constant and stored in the difference array. Before the next axis iteration, the soft difference values stored in the difference array are summed with the original soft decision values stored in the original memory array. In this way, the turbo product code decoder of the present invention is able to minimize iterative feedback information.

Figure 1:
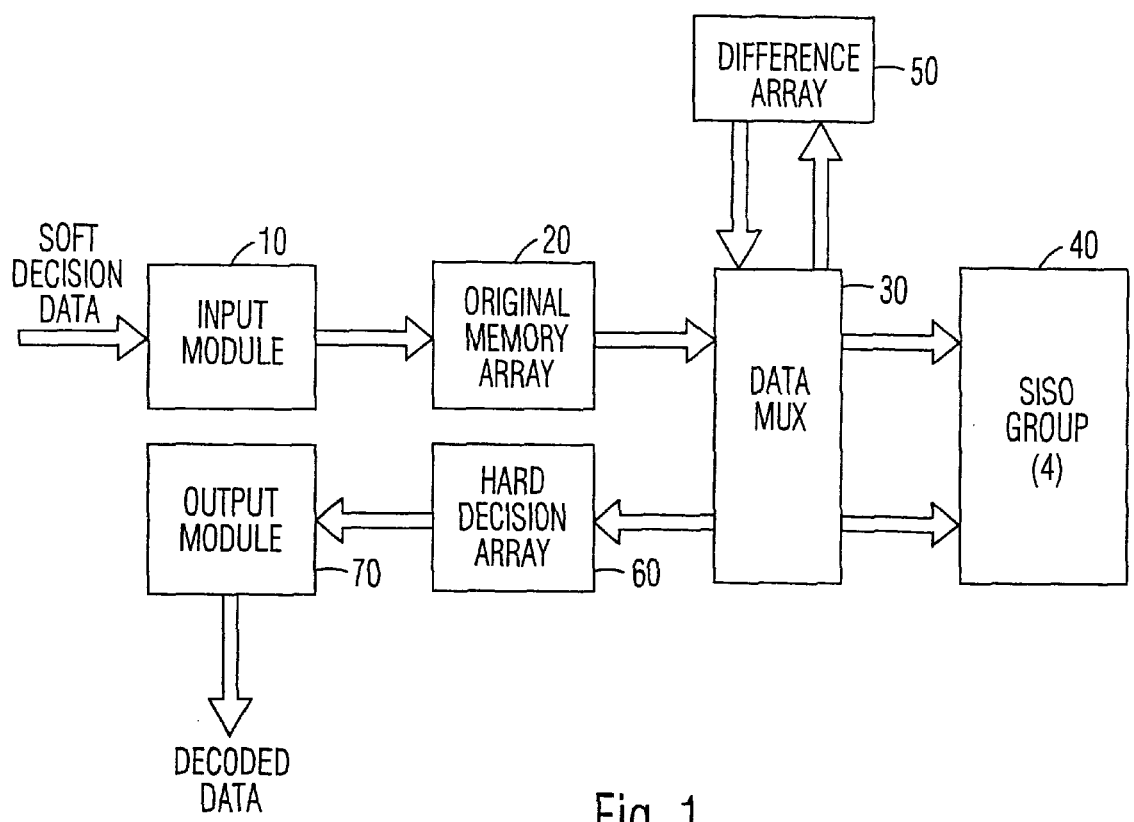
FIG. 1 shows a block diagram for the preferred embodiment of the turbo product code decoder of the present invention when decoding a two dimensional decoding scheme.

The structure and operation of the turbo product code decoder of the present invention shall now be discussed in greater detail. FIG. 1 shows a block diagram of the turbo product code decoder of the present invention. As shown, an input module 10 is coupled to an original memory array 20. The original memory array 20 is further coupled to a data multiplexer 30. The data multiplexer 30 is further coupled to a difference array 50, a SISO group 40, and a hard decision array 60. The hard decision array 60 is further coupled to an output module 70.

In operation, an incoming encoded bit stream is received by a demodulator (not shown) where it is demodulated and an soft decision operation is performed on this incoming encoded bit stream. The soft decision operation makes an initial determination of whether each bit in the incoming encoded bit stream is a "1" or a "0" (a hard decision bit value) and assigns a soft decision confidence value to that determination.

The soft decision confidence values and the hard decision bit values are output by the demodulator. These values are input to the input module 10 of the decoder. The input module then assigns a sign to each soft decision confidence value based upon the hard decision bit value. The soft decision confidence values are output from the input module 10 in a signed 2's complement notation, where the absolute numerical value represents the soft decision confidence value and the sign (+ or −) represents the hard decision bit value. A (+) sign represents a hard decision bit value of a binary "1", while a (−) sign represents a hard decision bit value of a binary "0". These soft decision confidence values are then stored in an original memory array 20.

The original memory array 20 is preferably a single standard static RAM design memory array having a plurality of memory cells organized into two dimensions comprising rows and columns. Preferably each memory cell location within a single columns is able to hold four soft values. The original memory array may be partitioned into segments or areas.

The information in the original memory array 20 is stored in a 2's complement notation, as either a +M or −M, wherein M represents the confidence value, and the sign (+) represents a binary 1, while (−) represents a binary 0.

After these soft decision confidence values have been stored in the original memory array 20, they are fed out through the data multiplexer 30 to the SISO group 40. This is done by sending the information from the original memory array 20 out on an x-row basis. The data multiplexer 30 feeds the x-row information to the SISO group 40 (which is actually made up of four decoders arranged in parallel) using a unique accessing scheme so that each four soft value words in the row can be decoded in parallel by the four decoders. This unique accessing scheme shall be described in further detail below. In the preferred embodiment, the present invention can handle up to four soft value words at one time, although it is understood that the turbo product decoder of the present invention may be configured to handle a higher degree of parallelism (more SISOs).

The decoder then decodes these initial soft decision values. The actual details of the decoding process are discussed in greater detail below; but, for now, it is understood that each SISO decoder in the SISO group 40 decodes by accepting the incoming vector and using the soft decision confidence values in the incoming vector to generate both a soft vector and a hard vector. The soft vector is comprised of the soft decision confidence values without any (+ or −) signs, while the hard vector is comprised of actual hard decision bit values of binary "1's" and "0's" which are dependent upon the sign of the each incoming soft decision confidence value. The SISO decoder then performs a series of manipulations and calculations on both the soft vector and hard vector in order to generate a plurality of nearest neighbor codewords which differ from the incoming vector by a predetermined number of bit positions. Preferably, the decoder is able to generate nearest neighbor codewords which differ from the hard decision decoded vector by four bit positions. Specialized nearest neighbor computation logic is used to perform these manipulations and calculations in order to generate the nearest neighbor codewords without the use of a lookup table. A difference metric is then assigned to each of the nearest neighbor codewords and the nearest neighbor codeword having the smallest difference metric is then chosen as the "closest" nearest neighbor. Each bit in the "closest" nearest neighbor is then assigned a new confidence value. Finally, difference values are calculated by comparing the new confidence value for each bit in the mth position in the "closest" nearest neighbor with the initial soft decision confidence value of the bit in the same mth position in the incoming vector.

After the decoding process is completed for each group of four vectors in the x-rows, the SISO group 40 outputs the soft decision difference values for each bit in the four vectors. These soft decision difference values are output from the SISO group 40 and passed back through the data multiplexer 30, where they are each multiplied by an x-axis feedback value, and stored in the difference array 50. The information in the difference array 50 is also stored in a 2's complement notation, as either a +M or −M, wherein M represents the multiplied difference value and the sign (+ or −) represents the direction in change in confidence for the bit. As an example, if the incoming soft decision confidence value had a (+) sign, representing a hard decision bit value of binary 1, then the soft decision difference value will have a (+) sign if the decoder determines that the bit value was a binary 1 and deserves a higher confidence. However, if the decoder determines that the bit may not be a binary 1, then the bit deserves a lower confidence value and the soft decision difference value will have a (−) sign. Likewise, if the incoming soft decision confidence value had a (−) sign, representing a hard decision bit value of binary 0, then the soft decision difference value will have a (−) sign if the decoder determines that the bit value was a binary 0 and deserves a higher confidence. However, if the decoder determines that the bit may not be a binary 0, then the bit deserves a lower confidence value and the soft decision difference value will be assigned a (+) sign.

As is easily understood that unlike conventional turbo product code decoders, the soft difference values which are output from the decoder of the present invention represent a confidence differential between iterations rather than a new confidence value per iteration. Thus, when the difference values which are output after each iteration are summed with the original data, the result will be more accurate. The decoding process is repeated for ny groups of vectors in the block.

Returning to the decoding process, the difference values from the decoding of the x-rows have now been multiplied by an x-axis feedback value and stored in the difference array 50. This information in the difference array 50 is then summed with the soft decision confidence values which are stored in the original memory array 20, thereby creating y-axis input data comprised of a plurality of y-axis soft decision values. The y-axis input data is then fed back into the SISO group 40, through the data multiplexer 30, on a y-column basis. The data multiplexer 30 feeds the y-axis input data to the SISO group 40 in parallel using a unique accessing scheme so that each four columns can be decoded in parallel. This unique accessing scheme shall be described in further detail below. In the preferred embodiment, the present invention can handle up to four soft value words at one time, although it is understood that the decoder may be configured to handle a higher degree of parallelism (more SISOs).

Once again, the decoder decodes the y-axis soft decision values by accepting the incoming soft value and generating both a soft vector and a hard vector. As explained earlier, the soft vector is comprised of the y-axis soft decision values without any (+ or −) signs, while the hard vector is comprised of actual hard decision bit values of binary "1's" and "0's" which are dependent upon the sign of the each incoming soft decision values. The SISO decoder then performs a series of manipulations and calculations on both the soft vector and hard vector in order to generate a plurality of nearest neighbor codewords which differ from the incoming vector by a predetermined number of bit positions. Preferably, the decoder is able to generate nearest neighbor codewords which differ from the soft value words by four bit positions. Specialized nearest neighbor computation logic is used to perform these manipulations and calculations in order to generate the nearest neighbor codewords without the use of a lookup table. A difference metric is then assigned to each of the nearest neighbor codewords and the nearest neighbor codeword having the smallest difference metric is then chosen as the "closest" nearest neighbor. Each bit in the "closest" nearest neighbor is then assigned a new confidence value. Finally, difference values are calculated by comparing the new confidence value for each bit in the mth position in the "closest" nearest neighbor with the incoming y-axis soft decision value of the bit in the same mth position in the incoming vector.

After the decoding process is completed for the four vectors in the group, the SISO group 40 will output soft decision difference values for the vectors. These soft decision difference values are again passed back through the data multiplexer 30, where they are each multiplied by a y-axis feedback value, and stored in the difference array 50. The old information from the decoding of the x-rows which was previously stored in the difference array 50 is overwritten with these new y-axis soft decision difference values. Once again, the information in the difference array 50 is stored in a 2's complement notation, as either a +M or −M, wherein M represents the confidence value, and the sign (+ or −) represents the degree of change in confidence. The decoding process is repeated for $n_y$ groups of vectors in the block.

The information in the difference array 50 is then summed with the initial soft decision confidence values stored in the original memory array 20 and sent back into the SISO group 40 on an x-row basis. The decoding process then repeats. This iterative process of decoding x-rows and y-columns is continued for x full iterations, wherein x is a predetermined number of iterations chosen by the user.

The stop iteration criteria used by the decoder will now be described in detail. For each vector decoded by one of the SISO decoders, the SISO outputs a CORRECTION signal indicating that a hard decision correction was made on the vector. A hard decision correction occurs when either the input vector is corrected to a center codeword, or a nearby codeword has a smaller difference metric than the center codeword, and is therefore chosen for the output codeword. If neither of these conditions occur, then the SISO will not assert the CORRECTION signal.

When all vectors for a given axis (x-rows, y-columns or z-columns) have been decoded by the SISOs, and no SISO indicates that a correction was made, then that axis is declared clean. The decoder keeps a running count of the clean axes. This count is reset for each axis that has a SISO indicate that a correction was made. It is incremented for each axis that has no corrections. When the count is equal to the number of dimensions in the block (2 or 3 in the preferred embodiment), the decoder declares the block decoded. At this point, one addition axis iteration is performed to sum all difference values with the initial soft decision values. This sum is converted to a hard decision output which is written to the Hard Decision Array.

Upon completion of the xth iteration, the soft decision difference values output from the xth iteration are multiplied. by the appropriate y-axis feedback multiplier and summed with the previous x-axis soft decision difference values, which should still be stored in the original memory array 20, in order to get a final confidence value for each bit (with the final sign of such value representing the binary 1 or 0). These final confidence values are then converted into hard decision values, consisting of binary "1's" and "0's", by the data multiplexer 30 and written to a hard decision array 60. The hard decision values are then output from the hard decision array 60 through the output module 70.

Figure 2:
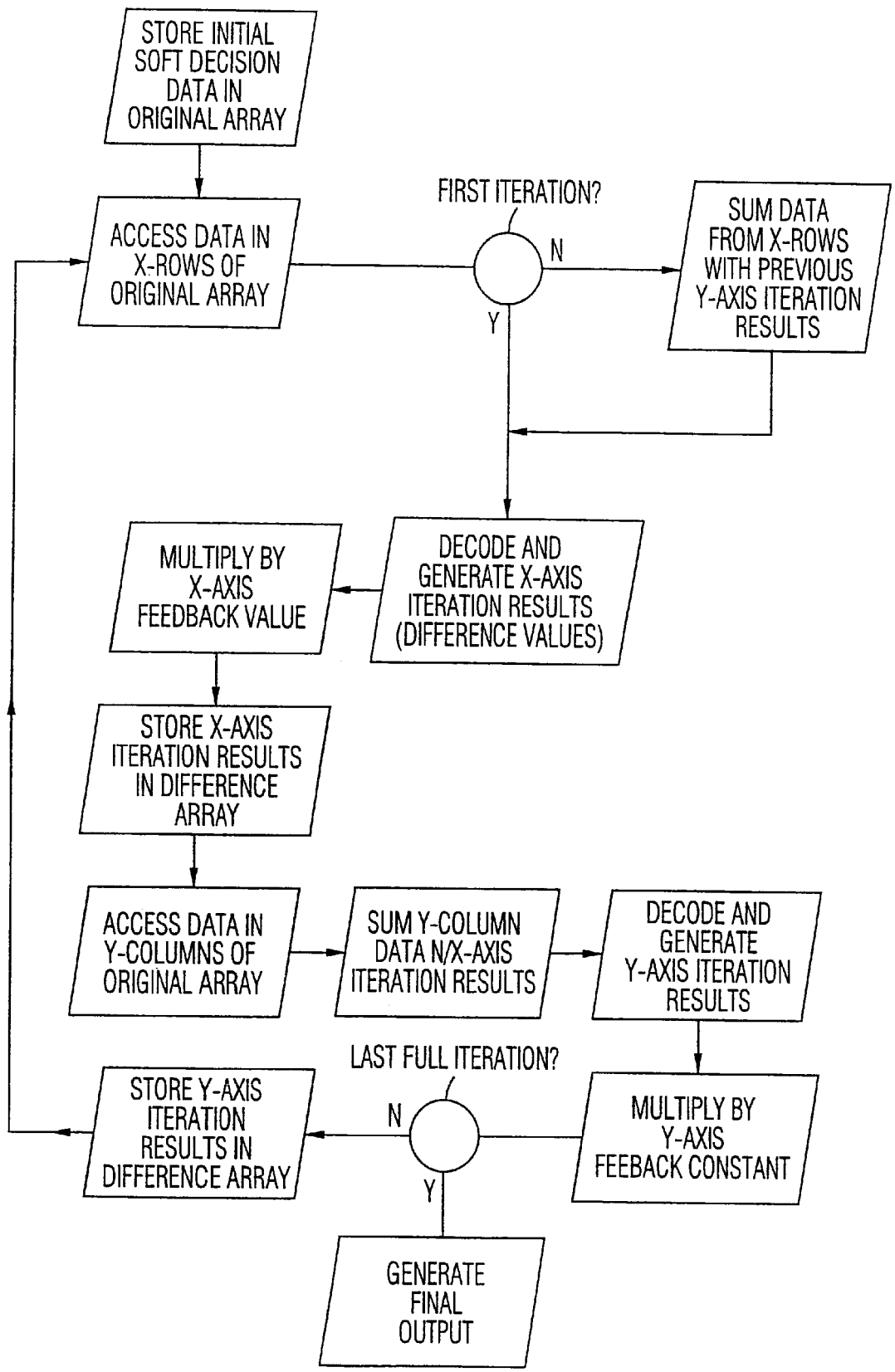
FIG. 2 shows the process for using the turbo product decoder of the present invention to decode data which has been encoded using a two dimensional coding scheme.

FIG. 2 shows the complete steps in the decoding process for using the turbo product decoder of the present invention to decode data which has been encoded using a two dimensional coding scheme. As shown, the initial soft decision confidence values are received from a demodulator and stored in the original array (Step 1). The x-row data is then accessed from the original array (Step 2) and, if this is the first iteration (Step 3), the x-row data is decoded in order to generate x-axis iteration results (Step 5). The x-axis iteration results are then multiplied by the x-axis feedback constant (Step 6), and stored in the difference array (Step 7).

The initial soft decision confidence values from the y-columns are then accessed from the original array (Step 8) and summed with the x-axis iteration results which are stored in the difference array (Step 9). The resulting sums are decoded by the SISO group and y-axis iteration results are generated (Step 10). The y-axis iteration results are multiplied by the y-axis feedback constant (Step 11). If this is the last full iteration (Step 12) the final output is generated (Step 13). If this is not the last full iteration, the y-axis iteration results are stored in the difference array, overwriting the previous x-axis iteration results which were stored in the difference array, and the process is repeated by returning to Step 2. However, when reaching Step 3, the decoder will determine that this is not the first x-axis iteration, and the data from the x-rows of the original memory array will be summed with the y-axis iteration results which are stored in the difference array (Step 4).

As explained in detail above, if the decoder determines that it has completed the last full iteration (Step 12) the final output will be generated (Step 13). This is done by summing the y-axis iteration results with the previous x-axis results, which are stored in the difference array, and the initial soft decision confidence values which are stored in the original array in order to generate final confidence values and hard decision values.

Figure 3:
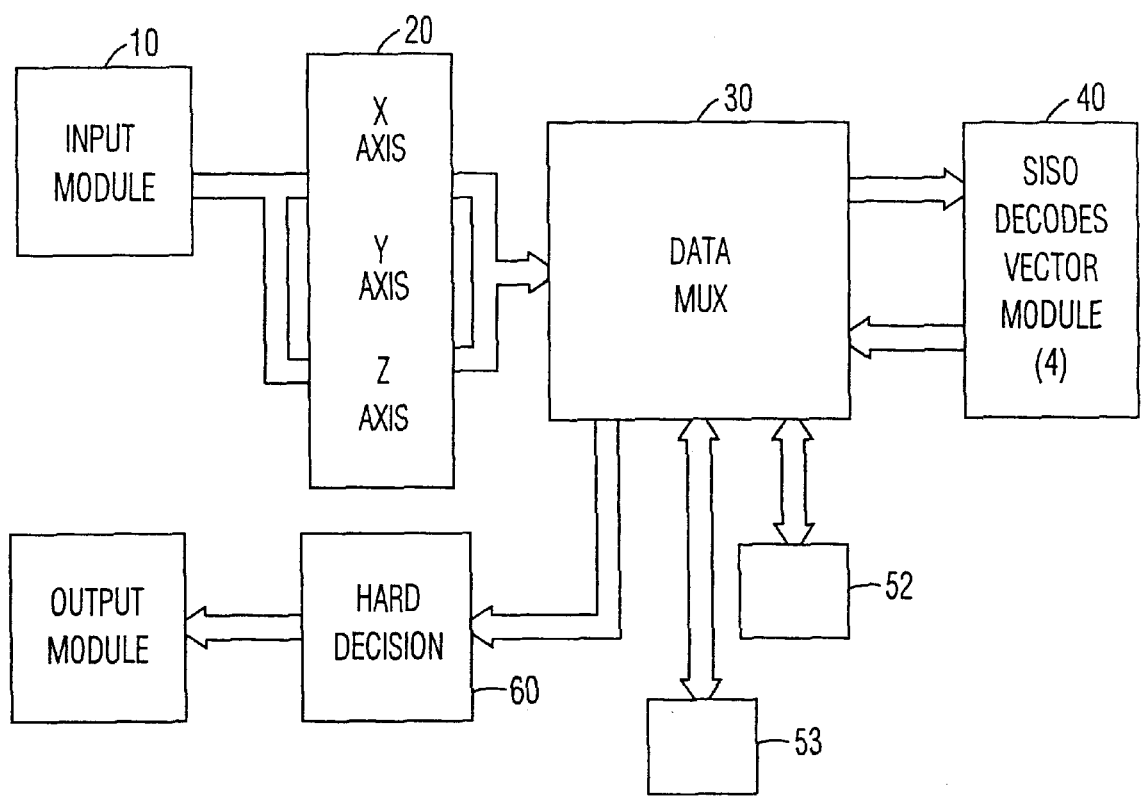
FIG. 3 shows a block diagram for the preferred embodiment of the turbo product code decoder of the present invention when decoding a three dimensional decoding scheme.

As explained earlier, the turbo product code decoder of the present invention may also be used to decode bit streams which have been block encoded with three dimensional or to higher encoding schemes. The process for decoding a bit stream of data which has been encoded with a three dimensional encoding scheme shall now be described in further detail. When decoding a three dimensional code or higher, the process for decoding is slightly different from the process used in decoding a two dimensionally encoded bit stream. FIG. 3 illustrates the preferred embodiment of the present invention when utilized in a three dimensional or higher decoding scheme. The same reference numerals are used as those in FIG. 1 where appropriate.

As shown in FIG. 3, an input module 10 is coupled to an original array 20 which is partitioned into two sections 22 and 23. The operation of the original array 20 will be explained further herein. The original memory array 20 is coupled to a data multiplexer 30. The data multiplexer 30 is further coupled to a first difference array 52, a second difference array 53, a SISO group 40, and a hard decision array 60. The hard decision array 60 is further coupled to an output module 70.

In operation, an incoming transmission bit stream is received by a demodulator (not shown) and the bit stream is demodulated. An initial soft decision operation is performed at the demodulator and initial soft decision confidence values are generated for each bit in the bit stream. The initial soft decision operation makes an initial determination of whether each bit in the incoming transmission bit stream is a 1 or a 0 (a hard decision bit value) and assigns a soft decision confidence value to that determination. The soft decision confidence values are output by the demodulator and fed into the input module 10 of the decoder. These soft decision confidence value are output in a signed 2's complement notation, where the numerical value represents the soft decision confidence value and the sign represents the hard decision bit value. A (+) sign represents a hard decision bit value of a binary 1, while a (−) sign represents a hard decision bit value of a binary 0. These initial or original soft decision confidence values are then deinterleaved by the input module and stored in the original memory array. It is understood that the incoming bit stream which was received by the demodulator was originally encoded with three different coding schemes in an x-axis direction, a y-axis direction, and a z-axis direction. The x-axis, y-axis and z-axis original soft decision confidence values are stored in the rows and columns of the original array 20.

The original memory array 20 is preferably a standard static RAM design memory array organized into rows and columns of memory cells. The information in the original memory array 20 is stored in a 2's complement notation, as either a +M or −M, wherein M represents the confidence value, and the sign (+) represents a binary 1, while (−) represents a binary 0.

After these initial soft decision confidence values have all been stored in the original memory array 20, the initial x-axis soft decision confidence values are first fed out through a data multiplexer 30 to the SISO group 40. The soft decision confidence values are fed out from the first section 22 of the original memory array 20 on an x-row basis. The data multiplexer 30 feeds the information to the SISO group 40 (which is actually made up of four decoders arranged in parallel) using a unique accessing scheme so that four vector words in the x-rows can be decoded in parallel by the four decoders. This unique accessing scheme shall be described in further detail below.

The decoder then decodes these initial soft decision values from the x-rows. The actual details of the decoding process are discussed in greater detail below; but, for now, it is understood that each SISO decoder in the SISO group 40 decodes by accepting the incoming vector and using the soft decision confidence values in the incoming vector to generate both a soft vector and a hard vector. The soft vector is comprised of the soft decision confidence values without any (+ or −) signs, while the hard vector is comprised of actual hard decision bit values of binary "1's" and "0's" which are dependent upon the sign of the each incoming soft decision confidence value. The SISO decoder then performs a series of manipulations and calculations on both the soft vector and hard vector in order to generate a plurality of nearest neighbor codewords which differ from the incoming vector by a predetermined number of bit positions. Preferably, the decoder is able to generate nearest neighbor codewords which differ from the soft value words by four bit positions. Specialized nearest neighbor computation logic is used to perform these manipulations and calculations in order to generate the nearest neighbor codewords without the use of a lookup table. A difference metric is then assigned to each of the nearest neighbor codewords and the nearest neighbor codeword having the smallest difference metric is then chosen as the "closest" nearest neighbor. Each bit in the "closest" nearest neighbor is then assigned a new confidence value. Finally, difference values are calculated by comparing the new confidence value for each bit in the mth position in the "closest" nearest neighbor with the initial soft decision confidence value of the bit in the same mth position in the incoming vector.

After the decoding process is completed for the four vectors in the x-rows, the SISO group 40 will output soft decision difference values for each bit in the four soft value word. These soft decision difference values are passed back through the data multiplexer 30, where they are multiplied by an x-axis feedback value, and stored in the first difference array 52. The information in the first difference array 52 is stored in a 2's complement notation, as either a +M or −M, wherein M represents the multiplied difference value and the sign (+ or −) represents a degree of change in confidence for the bit. As an example, if the input value had a (+) sign, representing a hard decision bit value of binary 1, then the output value will have a (+) sign if the decoder determines that the bit value was a binary 1 and deserves a higher confidence. However, if the decoder determines that the bit may not be a binary one, then a lower confidence value will be assigned and the soft decision difference value will have a (−) sign. Likewise, if the input had a (−) sign, representing a hard decision bit value of binary 0, then the output value will have a (−) sign if the decoder determines that the bit value was a binary 0 and deserves a higher confidence. However, if the decoder determines that the bit may not be a binary 0, then a lower confidence value will be assigned and the soft decision difference value will have a (+) sign.

The soft difference values from the x-axis iteration which are stored in the first difference array 52 are then summed with the original soft decision confidence values stored in the y-columns of the first section 22 of the original array 20, thereby generating y-axis input values. These y-axis input values are fed back into the SISO group 40, through the data multiplexer 30, on a column by column basis so that the y-axis can be decoded. The data multiplexer 30 feeds the information to the SISO group 40 in parallel using a unique accessing scheme so that four vectors in the y-columns can be decoded in parallel. This unique accessing scheme shall be described in further detail below. In the preferred embodiment, the present invention can handle up to four codewords at one time, although it is understood that the decoder may be configured to handle more than four codewords at one time.

The decoder then decodes these y-axis input values. As explained earlier, each of the four decoders in the SISO group 40 decodes by accepting an incoming vector and using the y-axis input values in the incoming vector to generate both a soft vector and a hard vector. The soft vector is comprised of the absolute values for each of the y-axis input values—i.e. the numerical value of each y-axis input value without any (+ or −) signs. The hard vector is comprised of actual hard decision bit values of binary "1's" and "0's" which are dependent upon the sign of the each y-axis input value. The SISO decoder then performs a series of manipulations and calculations on both the soft vector and hard vector in order to generate a plurality of nearest neighbor codewords which differ from the incoming vector by a predetermined number of bit positions. Preferably, the decoder is able to generate nearest neighbor codewords which differ from the soft value words by four bit positions. Specialized nearest neighbor computation logic is used to perform these manipulations and calculations in order to generate the nearest neighbor codewords without the use of a lookup table. A difference metric is then assigned to each of the nearest neighbor codewords and the nearest neighbor codeword having the smallest difference metric is then chosen as the "closest" nearest neighbor. Each bit in the "closest" nearest neighbor is then assigned a new confidence value. Finally, difference values are calculated by comparing the new confidence value for each bit in the mth position in the "closest" nearest neighbor with the initial soft decision confidence value of the bit in the same mth position in the incoming vector.

After the decoding process is completed for each codeword in the y-columns, the soft decision difference values are passed back through the data multiplexer 30, where they are multiplied by a y-axis feedback value, and stored in the second difference array 53. Once again, the information in the second difference array 53 is stored in a 2's complement notation, as either a +M or −M, wherein M represents the multiplied difference value, and the sign (+ or −) represents the degree of change in confidence.

The soft decision difference values stored in the second difference array (y-axis iteration results) are then summed with the soft decision difference values which are stored in the first difference array (x-axis iteration results) and the original soft decision confidence values for the z-axis which are stored in the second section 23 of the original array 20, thereby generating z-axis input values. These z-axis input values are then sent back into the SISO group 40 on a z-column basis so that the z-axis can be decoded.

Once the four vectors for the z-axis input values has been decoded, soft decision difference values are output from the SISO group. These soft decision difference values are each multiplied by a z-axis multiplier, and stored in the first difference array 52. Accordingly, the soft decision difference values from the z-axis iteration overwrites the soft decision difference values from the x-axis iteration which were previously stored in the first difference array 52.

The information which is stored in the second difference array (the y-axis iteration results) is then summed with the information in the first difference array (the z-axis iteration results) and the original x-row soft decision confidence values which are stored in the x-rows of the first section 22 of the original array 20, thereby generating new x-axis iteration input values. These new x-axis iteration input values are input to the SISO group 40 on an x-row basis. The decoding of these new x-axis iteration input values will be the second x-axis iteration of decoding. The decoder has already, at this point, decoded all axes (x, y and z) one time.

The soft decision difference values from this second x-axis iteration of decoding are then output from the decoder, multiplied by the x-axis multiplier, and stored in the second difference array 53. Thus, the soft decision difference values from this second x-axis iteration overwrite the previous y-axis iteration soft decision difference values which were previously stored in the second difference array 53.

It is readily understood that this process of decoding x-rows, y-columns and then z-columns is continued for a x number of full iterations (wherein a full iteration is defined as the decoding of all three axes x, y and z) and further wherein x is a predetermined number of iterations chosen by the user. Upon completion of the xth full iteration (which should end upon the decoding of a z-axis), the results soft decision difference values from a last z-axis decoding should be summed with the soft decision difference values stored in the first difference array (which should be the last x-axis iteration difference values), the soft decision difference values stored in the second difference array (these should be the last y-axis iteration difference values), and the initial soft decision confidence values stored in the first and second sections 22 and 23 of the original array 20 in order to get a final confidence value for each bit (with the final sign of such value representing the binary 1 or 0). This information is converted into a hard decision value (a binary 1 or 0) by the data multiplexer 30 and written to a hard decision array 60. The hard decision values are then output from the hard decision array 60 through the output module 70.

Figure 4:
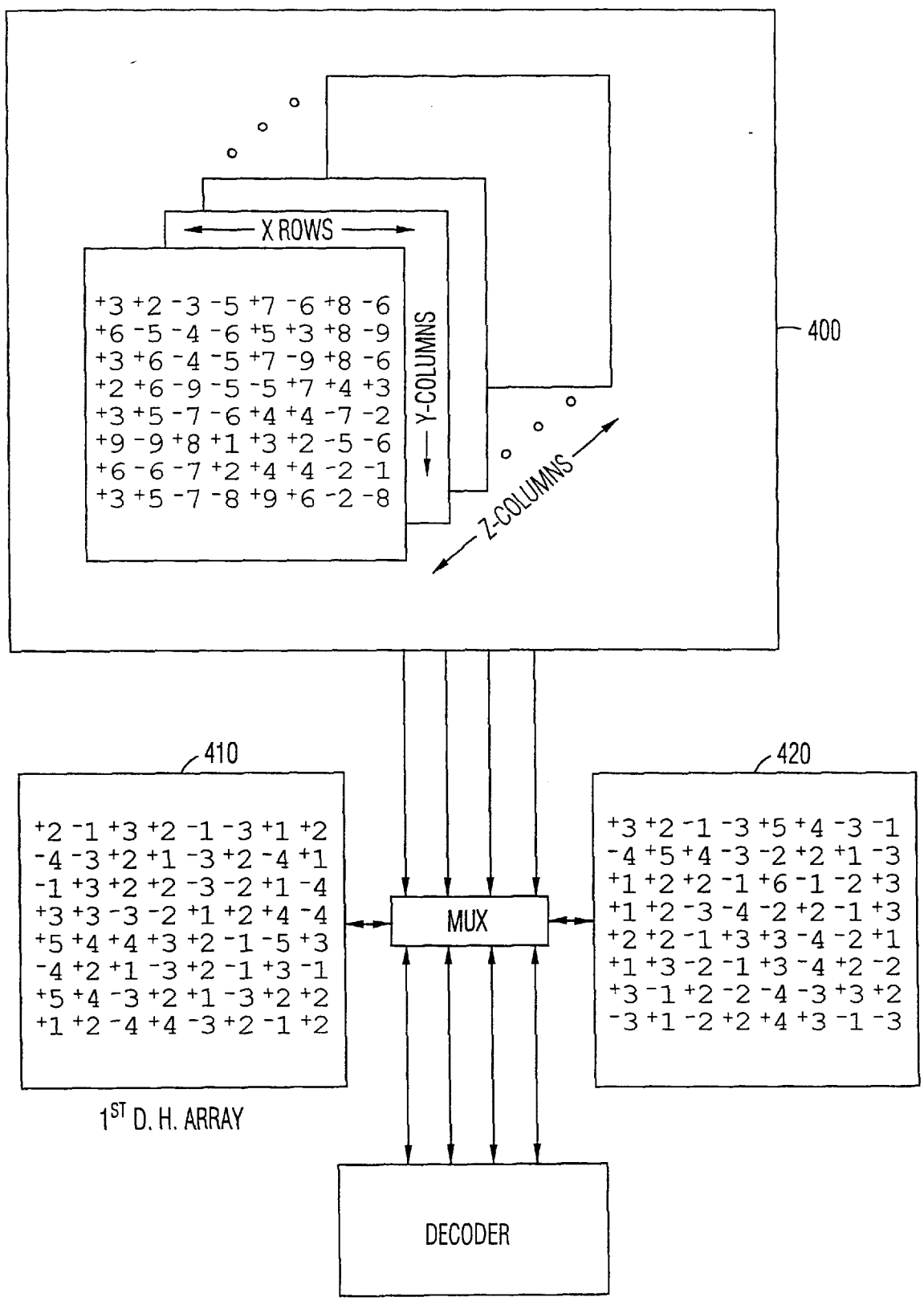
FIG. 4 illustrates an example of the iterative decoding process for a bit stream which has been encoded with a three dimensional coding scheme.

FIG. 4 illustrates an example of the iterative decoding process for a bit stream which has been encoded with a three dimensional coding scheme. FIG. 4 shows an original memory array 400 which has been partitioned into two sections. Initial soft decision confidence values are stored in the original memory array 400 in x-rows, y-columns and z-columns. For simplicity, FIG. 4 only shows a single soft value per location; but, it is understood that the actual original memory array of the turbo product code decoder preferably holds four soft value words per memory location. FIG. 4 also only shows a single plane of the three dimensional array.

In the decoding process, the x-rows are initially read out from the original memory array 400 on a row by row basis and decoded. As discussed earlier, soft decision difference values are generated for each bit in the codewords after the x-axis has been decoded. These values are multiplied by an x-axis feedback value and stored in a first difference array. FIG. 4 shows these values stored in a first difference array 410. In decoding the y-axis, the initial soft decision values in the y-rows will be summed with the soft difference values in the first difference array and read out on a column by column basis. Accordingly, the (+3) in the first position of the original array 400 will be summed with the (+2) in first position of the first difference array, the (+6) in the next y-column position of the original array 400 will be summed with the (−4) in the next column position of the first difference array, the (+3) from the next y-column position in the original array 400 will be summed with the (−1) from the next column position in the first difference array . . . and so on, until all the values in the first column have been added, thereby creating y-axis input values. These y axis input values are then decoded to generate y-axis soft decision difference values which are then multiplied by a y-axis feedback value and stored in a second difference array 420.

Then, the difference values in the second difference 420 array are summed with the difference values in the first difference array 410 and the values in the z-columns of the original memory array 400, thereby creating z-axis input values. Accordingly, the (+3) in the first position of the second difference array 420 is added to the (+2) in first position of the first difference array and the (+3) in the first z-column position of the original memory array 400, thereby creating a (+9) z-axis input value. This process is repeated moving through the z-column. As explained earlier, the difference values in the second difference array 420 are added with the values in the first difference array 410 and the original soft decision values in the z-columns, thereby generating z-axis input values. These z-axis input values are then decoded and z-axis difference values are generated.

The stop iteration criteria used by the decoder will now be described in detail. For each vector decoded by one of the SISO decoders, the SISO outputs a CORRECTION signal indicating that a hard decision correction was made on the vector. A hard decision correction occurs when either the input vector is corrected to a center codeword, or a nearby codeword has a smaller difference metric than the center codeword, and is therefore chosen for the output codeword. If neither of these conditions occur, then the SISO will not assert the CORRECTION signal.

When all vectors for a given axis (x-rows, y-columns or z-columns) have been decoded by the SISOs, and no SISO indicates that a correction was made, then that axis is declared clean. The decoder keeps a running count of the clean axes. This count is reset for each axis that has a SISO indicate that a correction was made. It is incremented for each axis that has no corrections. When the count is equal to the number of dimensions in the block (2 or 3 in the preferred embodiment), the decoder declares the block decoded. At this point, one addition axis iteration is performed to sum all difference values with the initial soft decision values. This sum is converted to a hard decision output which is written to the Hard Decision Array.

If this is the last full iteration, the z-axis difference values will be output from the decoder, multiplied by a z-axis feedback value and added to the difference values in the first difference array 410, the values in the second difference array 420, and the original soft decision confidence values stored in the x-rows, the y-columns and the z-columns of the original memory array 400, thereby creating final output values which will be converted to hard decision bit values. If it is not the last full iteration, the z-axis difference values will be stored in the first difference array 410, overwriting the values previously stored there, and the reiterative decoding process will continue.

Assume for illustrative purposes only that the decoder did not indicate a last full iteration. In this case, the difference values from the z-axis iteration will be multiplied by a z-axis feedback value and stored in the first difference array, thereby overwriting the previous x-axis difference values which were stored in the first difference array after the last x-axis iteration. Additionally, assume for illustrative purposes only that this has been done and the numbers contained in the first difference array of FIG. 4 now represent the multiplied z-axis difference values. On the next x-axis iteration, the values in the rows of the first difference array 410 (the z-axis difference values) will be summed with the values in the rows of the second difference array (the y-axis difference array) and the values in the x-rows of the original memory array 400, thereby creating x-axis input values. Accordingly, the difference value (+2) in the first row position of the first difference array 410, will be summed with the difference value (+3) in the first row position of the second difference array 420 and the original soft decision confidence value of (+3) stored in the first x-row position of the original memory array 400, thereby creating an x-axis input value of (+8). The difference value (−1) in the second row position of the first difference array 410, will be summed with the difference value (+2) in the second row position of the second difference array 420 and the original soft decision confidence value of (+2) stored in the second x-row position of the original memory array 400, thereby creating an x-axis input value of (+3). The difference value (+3) in the third row position of the first difference array 410, will be summed with the difference value (−1) in the third row position of the second difference array 420 and the original soft decision confidence value of (−3) stored in the third x-row position of the original memory array 400, thereby creating an x-axis input value of (−1). This process continues until the entire x-axis has been decoded.

After the entire x-axis has been decoded, the difference values from the x-axis iteration will then be multiplied by the x-axis feedback constant and stored in the second difference array 420, thereby overwriting the previous y-axis iteration difference values which were stored in the second difference array 420.

As discussed above, after each axis iteration (x, y or z) the soft decision difference values which are output from that axis iteration are multiplied by an appropriate feedback value and summed with the original soft decision values in the original memory array (in the case of three dimensional decoding the soft decision difference values from the two previous axis iterations are actually summed with the original soft decision data). The feedback value is different for each axis and is based upon the coding scheme and the number of full iterations desired. While the feedback value is different for each axis, the feedback value for each axis does not change and remains constant per each axis iteration. Accordingly, the soft decision difference values which are output after each x axis iteration will be multiplied by the appropriate x axis feedback value, the soft decision difference values which are output after each y axis iteration will be multiplied by the appropriate y axis feedback value, and the soft decision difference values which are output after each z axis iteration (in 3 dimensional codes) will be multiplied by the appropriate z axis feedback value.

As explained each time any axis is fully decoded and soft difference values are generated, the soft difference values are multiplied by an appropriate x, y or z axis feedback value. Although the x, y and z-axis feedback values may vary, the same x, y or z axis feedback value is always used each time that axis is decoded. Accordingly, every time the x-axis is decoded, the soft difference values are multiplied by the same x-axis feedback value, while each time the y-axis or z-axis is decoded, the difference values output will be multiplied by the same y-axis and z-axis feedback constants, respectively. The numerical value of each feedback value is determined in reference to the coding scheme and the number of full iterations desired. Generally, the higher the feedback value, the quicker the decoding process converges to a fixed hard decision bit value and, accordingly, less iterations are required. Conversely, the lower the feedback value, the slower the decoding process converges to a fixed hard decision bit value and, accordingly, more iterations are required. Preferably, the feedback values used for each code axis will preferably vary from $\frac{1}{4}$ to $\frac{11}{16}$ depending upon the number of iterations desired and the type of communication systems in which the turbo product code decoder is utilized.

Now that the overall operation of the turbo product code decoder of the present invention have been described for both two and three dimensional decoding, the specifics of the decoding process shall be discussed in further detail. Each time a decoding operation occurs, a group of four vectors is loaded into the SISO group, with each soft value in the word being represented with a W-axis input value (where the W-axis input value may be the x-axis input values, the y-axis input values, or the z-axis input values). These values are received into the SISO group of the present invention, with one soft value decoded by each of the four SISO decoders within the SISO group. The following will describe the operation of one SISO decoder.

Initially, a hard decision is performed on each bit in the vector in order to generate a hard decision vector H. This hard decision vector H will be corrected using the redundancy of the code into a center codeword having a length N with a binary 1 or 0 in each bit location. The decoder will then identify the set J of nearby codewords of Hamming distance four from the center codeword. Preferably, the decoder of the present invention is designed to identify all nearest neighbor codewords of Hamming weight four, although it is understood that the decoder may be alternately designed to identify all nearest neighbor codewords which differ from the center codeword by an alternate Hamming weight without departing from the spirit and scope of the invention. The set J of nearest neighbor codewords is identified by identifying those codewords having different or inverted bits in two fixed locations $I_1$ and $I_2$ as well as two variable locations $I_3$ and $I_4$. The first two locations $I_1$ and $I_2$ will remain constant throughout the decoding process and are based upon the two bit locations within the center codeword which have the lowest confidence values. The two other bit positions $I_3$ and $I_4$ are each computed using computation logic implemented within the SISO group.

Figure 5:
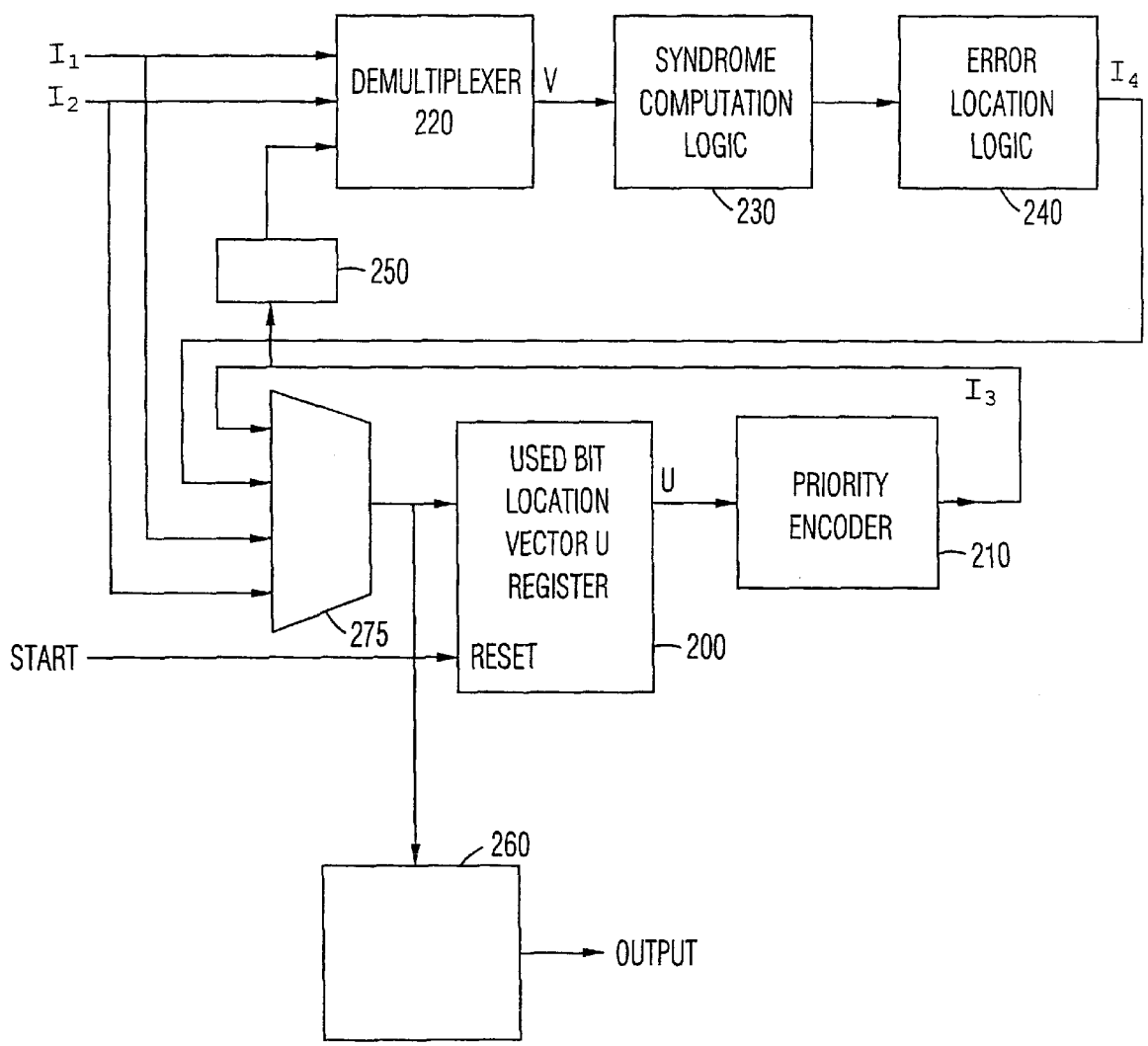
FIG. 5 shows a block diagram for the computation logic of the SISO group in the preferred embodiment of the present invention which is used to identify nearest neighbor codewords.

FIG. 5 shows a block diagram for the implementation of the computation logic of the SISO group which is used to identify the nearest neighbor codewords. As shown, the inputs $I_1$ and $I_2$ are coupled to a demultiplexer 220 and a multiplexer 275. The output of the demultiplexer 220 is coupled as an input to a syndrome computation logic module 230. The output from the syndrome computation logic module 230 is coupled as an input to an error location logic module 240. The output from the error location logic module is coupled to a first sequential shift register 250 and the multiplexer 275. The output of the multiplexer 275 is coupled to a second sequential shift register 260 and a used bit location vector U register 200 register. The used bit location vector U register 200 generates an output vector U. The output vector U is coupled to a priority encoder 210. A START signal is coupled to the Reset input of the vector U register 200 and is used to reset the vector U register 200.

In operation, the START signal is pulsed and the vector U register 200 is reset, creating a first used location vector U of length N which initially contains all zeros at the output of the vector U register 200. The locations of the two fixed bits $I_1$ and $I_2$ are determined, these are the two bit positions having the lowest confidence value in the center codeword of length N, and fed into the computation logic. The same two bit positions within the first used location vector U are set to a binary one. The first used location vector U is then passed into the priority encoder 210. Starting with the bit location U[0] and moving toward the bit location U[N], the first used location vector U will be searched by the priority encoder for the first location with a bit 0. This will be bit location $I_3$. The bit location $I_3$ is fed through the multiplexer 275 and stored in the second sequential register 260 for output. The bit location $I_3$ is also input to the first sequential register 250 for further processing.

The demultiplexer 220 then receives all three bit locations $I_1$, $I_2$ and $I_3$ and generates a second used location vector V of length N, with binary ones in the $I_1$, $I_2$, and $I_3$ bit locations and binary zeros in every other bit location $I_0$ through $I_N$. This second used location vector V is input into the syndrome calculation logic 230, which performs a Hamming code syndrome computation on the second used location vector V. The output from the syndrome calculation logic 230 is then passed into the error location logic module 240 which generates the location of the error bit from the Hamming code syndrome computation. This error bit location is used for the value of the $I_4$ bit location and is sent to the second sequential register 260 for output. The bit location $I_4$ in the second used location vector V is set to a binary 1.

The values for $I_1$, $I_2$, $I_3$, and $I_4$ are then all output from the second sequential register 260. Accordingly, the first nearest neighbor is found which has different bit values from the center codeword in these bit locations $I_1$, $I_2$, $I_3$, and $I_4$ and the same bit values as the center codeword in all other bit locations. The process is then repeated with the second used vector V now being treated as the used vector U. Accordingly, the next $I_3$ and $I_4$ bit locations are calculated, with a new second used vector $V_1$ being generated. This process repeats until all of the nearest neighbor codewords have been identified.

Once all of the nearest neighbor codewords in the set J have been identified, the decoder of the present invention will assign a difference metric (DM) to each individual nearest neighbor codeword. The difference metric for each nearest neighbor codeword in the set of J nearest neighbor codewords is defined by the following relationship:

$$DM_{Jth} = \Sigma \delta_{Jth}(I)\alpha(I)$$

for

I=0 to N.

The nearest neighbor codeword with the minimum difference metric (DM) will be temporarily stored as the "closest" nearest neighbor. The decoder will then perform an exclusive- or (XOR) operation between each bit in the center codeword and the corresponding bit in the "closest" nearest neighbor codeword. The result of this XOR operation becomes the new output codeword.

Each bit m of the new output codeword is then assigned a soft confidence value by the decoder. This soft confidence value is based upon the difference between difference metric values for the new output codeword as is and/or with the bit in the $m_{th}$ position inverted. For example, if the new output codeword had a difference metric of (65) with the first bit in the 0th position being a binary 1 and the output codeword would have a difference metric of (72) with the first bit in the 0th position being a binary 0, then the difference between the first difference metric (65) and the second difference metric (72) is used to assign a new confidence value to the 0th bit position.

Finally, the decoder will calculate a soft difference value for each bit in the new output codeword. This soft difference value represents the difference between the confidence value assigned to each bit m in the new output codeword and the confidence value assigned to each bit in the same bit position within the input codeword. It is this soft difference value which is actually output by the decoder on each iteration. This soft difference value is given a sign (+) or (−) to indicate the degree in change between the decision as to whether the bit is a corresponding binary 1 or binary 0. As described earlier, if the input value had a (+) sign, representing a hard decision bit value of binary 1, then the output value will have a (+) sign if the decoder determines that the bit value was a binary 1 and deserves a higher confidence. However, if the decoder determines that the bit may not be a binary one, then a lower confidence value will be assigned and the output will have a (−) sign. Likewise, if the input had a (−) sign, representing a hard decision bit value of binary 0, then the output value will have a (−) sign if the decoder determines that the bit value was a binary 0 and deserves a higher confidence. However, if the decoder determines that the bit may not be a binary 0, then a lower confidence value will be assigned and the output will have a (+) sign.

Figure 6A:
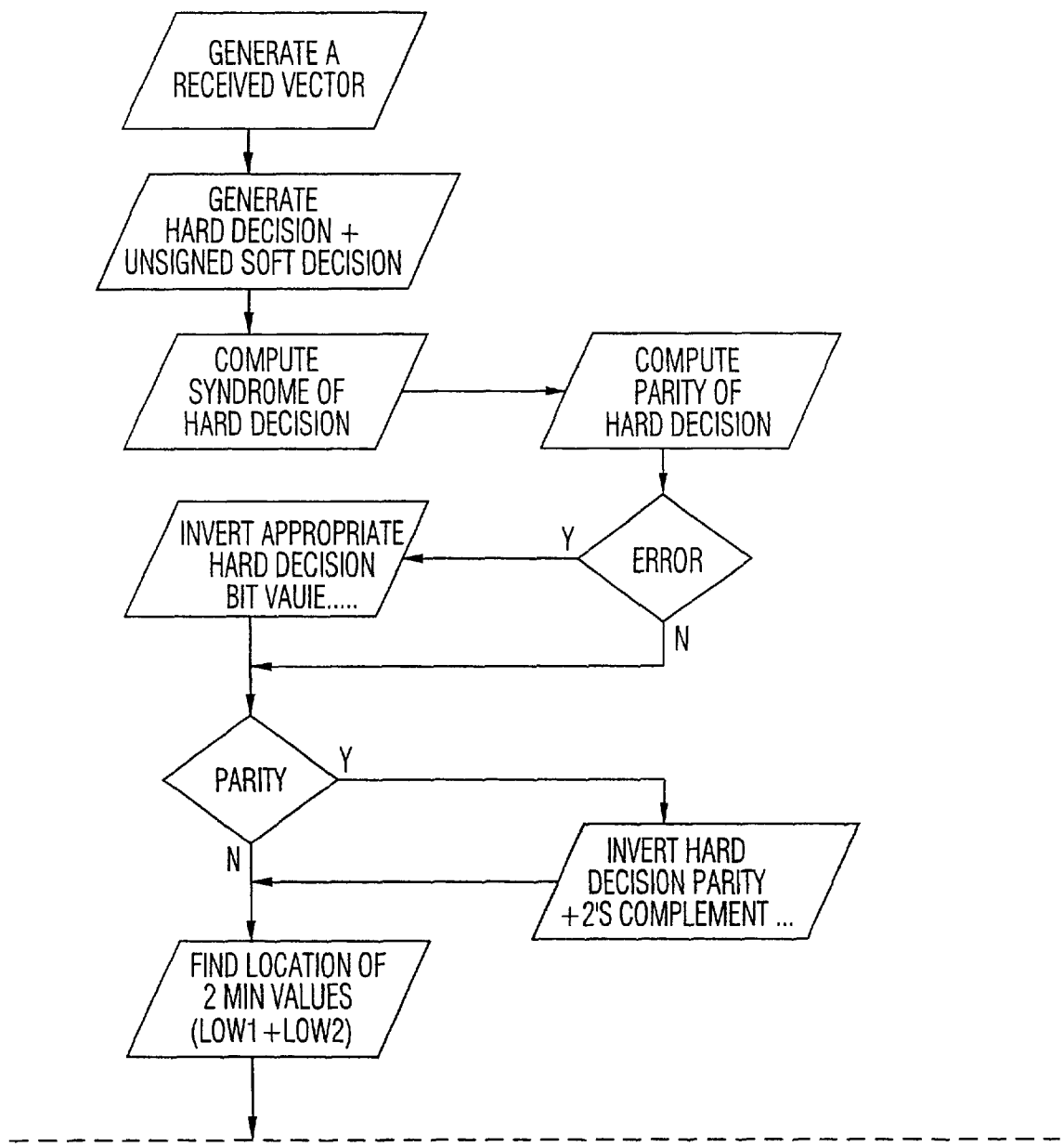
FIGS. 6*a* and 6*b* show all the steps in the decoding process used by the SISO group in the turbo product code decoder of the present invention.
Figure 6B:
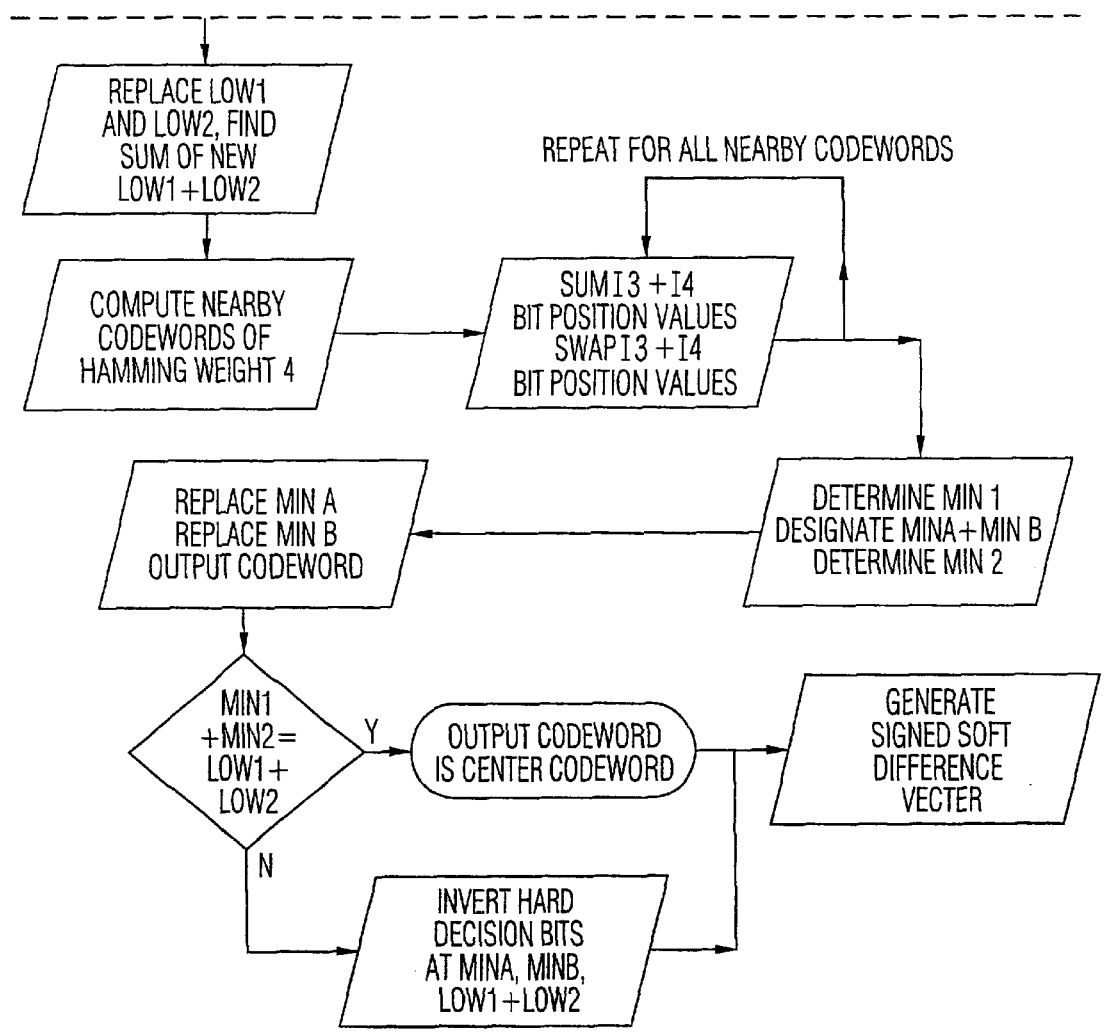

Accordingly, now that the each step in the decoding process has been explained, the complete steps for the decoding process of the turbo product decoder of the present invention can now be set forth in complete order. In reviewing these steps, it is understood that the incoming vector is defined as the input to a SISO. On the first iteration, this incoming vector is comprised of a row from the initial soft decision data stored in 2's complement notation within the original array. On subsequent decoding iterations, this incoming vector is comprised of the previous iteration soft difference values, which are stored in 2's complement notation within the difference array(s), summed with the initial soft decision data. The steps for the actual decoding process are set forth in FIGS. 6a and 6b as follows:

1. For each incoming vector, initially generate a received vector wherein the received vector represents signed soft decision values for each bit in the incoming codeword. A positive sign represents a binary 1 bit and a negative sign represents a binary 0 bit with the actual value representing the confidence value for that bit.

2. Retrieve the received vector and generate a hard decision vector and an unsigned soft decision vector. The unsigned soft decision vector is actually identical to the received vector but without the (+) and (−) signs. Instead, absolute values are used in the individual bit positions. The hard decision vector is generated by placing binary "1's" and "0's" in each bit position with a negative (−) incoming soft decision value for a bit in the codeword yielding a "0" hard decision bit value in the hard decision vector, and a positive (+) incoming soft decision value for a bit in the vector yielding a "1" hard decision bit value in the hard decision vector.

3. Compute the syndrome of the hard decision vector.

4. Compute the 1 bit parity of the hard decision vector.

5. If the syndrome calculation indicates that there is an error, correct the error by inverting the appropriate hard decision bit value in the hard decision vector and 2's complementing the unsigned soft decision value in the same bit position in the soft decision vector.

6. If the parity was correct and step 4 required the hard decision bit value to be inverted, or if the parity was incorrect and step 4 did not require the hard decision bit value to be inverted, then invert the hard decision parity bit value in the hard decision vector and 2's complementing the soft decision value for the last bit in the soft decision vector.

7. Find the location of the two minimum values in the soft decision vector, these represent the bits with the lowest confidence value assigned, and designate these locations as LOW1 and LOW2. As described earlier, these bit positions are also referred to $I_1$ and $I_2$.

8. Replace the soft. decision value at location LOW1 ($I_1$) with the 2's complement of the soft decision value at location LOW2 ($I_2$) and replace the soft decision value at location LOW2 ($I_2$) with the 2's complement of the soft decision value at location LOW1 ($I_1$). Furthermore, find the sum of these new soft decision values at locations LOW1 ($I_1$) and LOW2 ($I_2$) for later use.

9. Compute the set of nearby codewords with Hamming weight 4 which have 1's in locations LOW1 ($I_1$) and LOW2 ($I_2$). For (n, k) codes, this will yield a set of (n/2−1) codewords. Each of these nearby codewords will have a 1 in locations LOW1 ($I_1$) and LOW2 ($I_2$), and two other locations ($I_3$ and $I_4$). These two other locations are to be designated Nc1 ($I_3$) and Nc2 ($I_4$). As described earlier, these two other locations are also referred to as $I_3$ and $I_4$.

10. Find the sum of the soft decision values for bit locations Nc1 ($I_3$) and Nc2 ($I_4$) in the soft decision vector. Swap the soft decision value at location Nc1 ($I_3$) with the soft decision value at location Nc2 ($I_4$). Repeat this procedure for each nearby codeword which was computed in step 9.

11. From the sums computed in steps 8 and 10, determine which soft decision value sum is the lowest and designate this sum as Min1. Determine which two bit locations created the sum Min1 (i.e. which two bit locations within the soft decision vector gave the lowest sum) and designate these two bit locations as MinA and MinB. Furthermore, determine the next lowest soft value sum from steps 8 and 10, and designate this as Min2.

12. Replace the value at bit location MinA in the soft decision vector with the value of Min2 minus the current value at bit location MinA. Replace the value at bit location MinB in the soft decision vector with the value of Min2 minus the current value at bit location MinB. Subtract the value of Min1 from the values in all other bit locations in the soft decision vector. If the locations of Min1 and Min2 are the same as the locations of LOW1 ($I_1$) and LOW2 ($I_4$) (independent of order), then the output codeword is the center codeword. Otherwise, invert the hard decision bits in the hard decision vector at location MinA, MinB, LOW1 ($I_1$) and LOW2 ($I_2$).

13. For each bit in the output codeword generate signed difference output values. This accomplished by 2's complementing all soft values in the soft decision vector at bit locations which correspond with bit locations in the hard decision vector having a 0 in their location. The soft decision vector becomes the output vector.

The SISO decoding steps are broken down into three cycles in the implementation: the load cycle, the process cycle, and the unload cycle. The load cycle is executed in $n_x$ clocks, where $n_x$ is the length, in bits of the vector to decode. The load cycle occurs as the data is being read from the initial and difference arrays. The load cycle executed the first steps of the decoding algorithm (steps 1 through 7). The second cycle also executes in $n_x$ clocks. The process cycle executes steps 8 through 11 of the decoding algorithm. The unload cycle also executes in $n_x$ clocks, and executes the remaining steps in the algorithm. These cycles are executed as the data is written to the difference array.

The SISO hardware is segmented into three sub-blocks. Each sub-block executes one of the three cycles of the decode process. All three sub-blocks operate consecutively, thus allowing a single SISO to decode three vectors in parallel. It is designed as a pipe, where each stage in the pipe operates on one vector. After the pipe is full (two full vectors are loaded into the SISO), it executes all three cycles at once, each on a different vector. One vector is being loaded by the loader sub-block, while the previous vector is being processed by the process sub-block, and another vector is being unloaded by the unloader sub-block.

As discussed earlier, in order to achieve a higher data processing rate, the turbo product decoder of the present invention includes a SISO group which decodes the data in parallel using four actual SISO decoders. Each axis iteration (x, y and z) is processed in parallel, thereby multiplying the overall data pass through rate of the decoder. In order to facilitate this parallel decoding, the invention accesses data from the original memory array and difference arrays using a unique accessing method. FIG. 6 shows a 2-dimensional memory of the present invention which is intended to represent the structure of either the original memory array or either of the difference arrays.

As illustrated in FIG. 7, the original memory array and the difference arrays are structured RAMs having multiple memory locations. While FIG. 7 shows only block representations of each memory location, it is understood that each block representation actually holds a plurality of memory cells sufficient to hold the entire four soft value word stored in each memory location. It is further understood that while FIG. 7 only shows memory locations $G_0$ through $G_{19}$, both the difference arrays and the original memory array may have additional memory locations, and the same is not intended as a limitation but only as a reference in furtherance of the proceeding explanation. For a two dimensional code, the RAM will have $n_x/4$ times $n_y$ locations with each location storing four soft values. For a three dimensional code, the RAM will have $n_x/4$ times $n_y$ times $n_z$ locations with each location storing four soft values.

As shown in FIG. 7, the data is stored in the original array and the difference arrays in four soft value words. As explained earlier, each bit in the four soft value words is represented by an S soft decision value, with the S values stored in the original memory array representing the original demodulated soft decision data and the S values stored in the difference arrays representing the soft decision difference values between iterations. Further, as described earlier, all of the data in both the original array and the difference arrays is stored in a signed 2's complement notation. When the y-columns or z-columns of either the original array or the difference arrays are accessed for decoding, the first memory location $G_0$ is accessed and each one of the four different soft values is read into the SISO group and sent to each of the four separate SISO decoders, such that each of the separate SISO decoders has one soft value of the four soft value word stored in the memory location. On the next decode access, $G_4$ is accessed. Once again, a four soft value word stored in the memory location $G_4$ is loaded into the SISO group and each of the four soft values in the codeword is sent to the four separate SISO decoders. On the third access, $G_8$ is accessed. Once again, the entire four soft value word stored in the memory location $G_8$ is loaded into the SISO group and each of the four vectors is sent to a separate SISO decoder within the SISO group. Once decoding is accomplished for every location in the first column (memory location $G_0$ through memory location $G_{16}$), the process begins again for all of the memory locations in the second column $G_1$ through $G_{17}$. As explained, this accessing scheme is used for both the original array and the difference arrays when decoding the y-columns or z-columns. Using this accessing scheme, the entire group of four vectors can be accessed using $n_y$ or $n_z$ RAM accesses.

When the rows or x axis iteration is initiated, the turbo product code decoder of the present invention utilizes four row/column transformers, wherein each row/column transformer is coupled to a separate one of the four SISO decoders in the SISO group. These row/column transformers allow access of the data in the original array and the difference array at four vectors per clock signal. Initially, when accessing the x-rows, the information is read from the original array and the difference arrays from the first four memory locations in the first column $G_0$, $G_4$, $G_8$ and $G_{12}$. However, unlike the processing of the y-columns and the z-columns, the four vectors from each location is stored in one of the four row/column transformers. On the next clock cycle, the row/column transformers begin sending the words to the SISO decoders, with the one vector per clock being sent to the SISO decoders. When the first row/column transformer has decoded the entire word, the data from the memory locations in the first four rows in the second columns of the original array and the difference array $G_1$, $G_5$, $G_9$ and $G_{13}$ is then loaded into the four row/column transformers. Note that this loading of the row/column transformer occurs at the same time that the data is sent to the SISOs. This means that the first row/column transformer is ready for the next word when it has completed sending the previous word to the SISO. The four row/column transformers are each bidirectional such that the soft decision difference values of each decode operation may be unloaded and passed back through the data multiplexer into the difference arrays, while the incoming values are loaded into the four row/column transformers for processing by the SISO decoders. Once all of the codewords in the first four x-rows have been decoded and the results stored in the difference arrays, the data from the next four rows is loaded into the four row/column transformers in the same fashion until all of the x-rows have been decoded.

This transformation scheme allows each of the four SISOs to receive one soft value per clock when decoding rows of the array, even though the rows of the array are stored in the RAM with four soft values per location. This is valuable because it allows the same SISO decoders to be used when processing rows, columns, or z-columns of the array. It also allows all four SISOs to operate at their maximum. data rate when decoding each axis of the array. finally, this scheme works with standard static RAMs, and does not require any custom RAM features, and is therefore a very portable design.

While the present invention has been described in terms of specific embodiments incorporating details to facilitate the understanding of the principles of construction and operation of the invention, such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to those skilled in the art that while the preferred embodiment of the turbo decoder for the present invention has been described in terms of two and three dimensional decoding, such a method of decoding can also be utilized in decoding data which has been encoded in a multi-dimensional pattern. It will also be apparent to those skilled in the art that the values of the multiplying or feedback coefficients which are applied after each axis iteration may vary depending on the system requirements without departing from the spirit and scope of the invention.

What is claimed is:

1. A turbo product code decoder comprising:

a. means for storing a plurality of initial soft decision values, wherein the means for storing includes a predetermined number of memory cells each storing a plurality of initial soft decision values arranged as an array having x-rows and y-columns;

b. means for retrieving and decoding the plurality of initial soft decision values stored in the x-rows, thereby generating a plurality of x-axis iteration values and outputting a plurality of x-axis results, wherein a single x-axis result within the plurality of x-axis results represents a numerical difference between a single initial soft decision value in the plurality of soft decision values and a single x-axis iteration value in the plurality of x-axis iteration values;

c. means for summing the plurality of x-axis results with the plurality of initial soft decision values stored in the y-columns, thereby generating a plurality of y-axis input values; and d. means for decoding the plurality of y-axis input values, thereby generating a plurality of y-axis iteration values and outputting a plurality of y-axis results, wherein a single y-axis result within the plurality of y-axis results represents a numerical difference between a single y-axis input value in the plurality of y-axis input values and a single y-axis iteration value within the plurality of y-axis iteration values.

2. The turbo product code decoder as claimed in claim 1, further comprising a first means for saving the x-axis results and a second means for saving the y-axis results.

3. The turbo product code decoder as claimed in claim 1, further comprising a means for multiplying each x-axis result within the plurality of x-axis results by an x-axis coefficient before summing the plurality of x-axis results with the plurality of initial soft decision values which are stored in the y-columns.

4. The turbo product code decoder as claimed in claim 1, wherein the predetermined number of memory cells arranged in the x-rows and y-columns are further comprises memory cells arranged into z-columns, and further wherein the plurality of initial soft decision values are stored in the x-rows, the y-columns and the z-columns.

5. The turbo product code decoder as claimed in claim 4, further comprising:
   a. means for summing the plurality of x-axis results with the plurality of y-axis results and the plurality of initial soft decision values stored in the z-columns, thereby generating a plurality of z-axis input values; and
   b. means for decoding the plurality of z-axis input values, thereby generating a plurality of z-axis iteration values and outputting a plurality of z-axis results, wherein a single z-axis result within the plurality of z-axis results represents a numerical difference between a single z-axis input value within the plurality of z-axis input values and a single z-axis iteration value within the plurality of z-axis iteration values.

6. The turbo product code decoder as claimed in claim 5 further comprising:
   a. means for summing the plurality of x-axis results with the plurality of y-axis results, the plurality of z-axis results and the plurality of initial soft decision values stored in the x-rows, y-columns and z-columns, thereby generating a plurality of final decision values; and
   b. means for generating a plurality of hard decision bit values, wherein a single bit value within the plurality of hard decision values is represented by a binary "1" or a binary "0" depending upon a corresponding final decision value within the plurality of final decision values.

7. The turbo product code decoder as claimed in claim 1 further comprising means for terminating iterations of a decoding process upon reaching a predetermined number of iteration cycles.

8. The turbo product code decoder as claimed in claim 1 further comprising means for automatically terminating iterations of a decoding process upon sensing a predetermined condition in the turbo product code decoder.

9. The turbo product code decoder as claimed in claim 8 wherein the predetermined condition is no further modifications to data will occur.

10. The turbo product code decoder as claimed in claim 1 further comprising a transformer for receiving a plurality of x-row values and converting it to a plurality of y-column values and vice versa, wherein the turbo product decoder can selectively operate on rows and columns.

11. The turbo product code decoder as claimed in claim 1 further comprising a transformer for receiving one of row data, column data and z-column data and selectively converting it to a selected one of another data type, wherein the turbo product decoder can selectively operate on rows, columns and z-columns.

12. A turbo block code decoder for receiving an encoded message having a plurality of bits, and outputting a decoded codeword, the turbo block code decoder comprising:
   a. means for receiving the encoded message, wherein each bit in the plurality of bits in the encoded message is represented by an initial soft decision value in a plurality of initial soft decision values, the initial soft decision values arranged in a first array and in a second array;
   b. means for storing each initial soft decision value in the plurality of initial soft decision values coupled to the means for receiving; and
   c. means for iteratively decoding the encoded message coupled to the means for storing, wherein said means for iteratively decoding the encoded message retrieves the plurality of initial soft decision values in the first array and calculates a new soft decision value for each bit in the first array, thereby creating a plurality of new soft decision values, and further wherein the means for iteratively decoding generates a soft difference value for each bit in the first array, thereby creating a plurality of soft difference values, wherein each soft difference value is equal to a numerical difference between the new soft decision value for the bit in the first array and the initial soft decision value for the same bit in the first array, wherein the plurality of soft difference values is combined with the plurality of initial soft decision values in the second array to generate a subsequent soft difference value for each bit in the second array.

13. The turbo block decoder of claim 12, further comprising: means for multiplying each soft difference value in the plurality of soft difference values in the first array by an x-axis feedback constant.

14. The turbo block decoder of claim 12, wherein the initial soft decision value for each bit in the encoded message is stored in the means for storing in a signed 2's complement notation with the absolute value of the 2's complement notation representing a confidence value for the bit and the sign of the 2's complement notation representing a hard decision bit value for the bit.

15. The turbo block decoder of claim 12, wherein the means for iteratively decoding the encoded message includes:
   a. a soft-in/soft-out group having a plurality of soft-in/soft-out decoders arranged in parallel; and
   b. a difference memory array for storing the plurality of soft difference values.

16. The turbo block decoder of claim 15, wherein each soft-in/soft-out decoder in the plurality of soft-in/soft-out decoders includes a nearest neighbor computation logic module for generating a plurality of nearest neighbor codewords in the event the soft-in/soft-out decoder generates a hard decision corrected vector, and further wherein each nearest neighbor codeword in the plurality of nearest neighbor codewords has a same number of bits as the plurality of bits in the encoded message and differs from the hard decision corrected vector by a predetermined number of bit positions.

17. The turbo block decoder of claim 16, wherein the predetermined number of bit positions is four and two of the bit positions remain fixed, while the other two bit positions may vary.

18. A turbo block code decoder for receiving an encoded message having a plurality of bits and outputting a decoded codeword comprising:
   a. an input module for receiving the encoded message, wherein each bit in the encoded message is represented by an initial soft decision value;
   b. an original memory array coupled to the input module for storing the initial soft decision values;
   c. a soft-in/soft-out group coupled to the original memory array for receiving the initial soft decision values in a first predetermined axis and decoding the encoded message, wherein the soft-in/soft-out group calculates a new soft decision value for each bit in the first predetermined axis and generates a soft difference value for each bit in the first predetermined axis, and further wherein the soft difference value is equal to a numerical difference between the new soft decision value and the initial soft decision value in the first predetermined axis; and
   d. a difference memory array coupled to the soft-in/soft out group for storing the soft difference values, wherein each soft difference value in the difference memory array is combined with the initial soft decision values in a second predetermined axis to generate a new soft difference value for each bit in the second predetermined axis.

19. The turbo block decoder of claim 18, wherein the initial soft decision values are stored in the original memory array in a signed 2's complement notation with an absolute value of the 2's complement notation representing a confidence value and a sign of the 2's complement notation representing a hard decision bit value.

20. The turbo block decoder of claim 18, wherein the soft-in/soft-out group includes a plurality of soft-in/soft-out decoders arranged in parallel, and further wherein the initial soft decision values are arranged into a plurality of blocks with each block being decoded by one of the plurality of soft-in/soft-out decoders in order to generate the soft difference value for each bit in the plurality of blocks.

21. The turbo block decoder of claim 20, wherein each of the plurality of soft-in/soft-out decoders in the soft-in/soft-out group includes a computation logic module for generating a plurality of nearest neighbor codewords, wherein each nearest neighbor codeword in the plurality of nearest neighbor codewords differs from the block being decoded by a predetermined number of bit positions.

22. A method of iteratively decoding a received block of data having a plurality of bits represented by a plurality of initial soft decision values, the method comprising the steps of:
   a. storing the plurality of initial soft decision values in a memory array having x-rows and y-columns;
   b. decoding the plurality of initial soft decision values stored in the x-rows, thereby creating a plurality of new x-axis soft decision values;
   c. generating a plurality of x-axis difference values, wherein said plurality of x-axis difference values represent a numerical difference between the plurality of new x-axis soft decision values and the plurality of initial soft decision values stored in the x-rows;
   d. multiplying the plurality of x-axis difference values by an x-axis feedback constant, thereby generating a plurality of x-axis iteration output values, wherein the x-axis feedback constant remains constant for the decoding of the plurality of initial soft decision values stored in the x-rows;
   e. summing the plurality of x-axis iteration output values with the plurality of initial soft decision values stored in the y-columns, thereby generating a plurality of y-axis input values;
   f. decoding the plurality of y-axis input values, thereby creating a plurality of new y-axis soft decision values;
   g. generating a plurality of y-axis difference values, wherein said plurality of y-axis difference values represent a numerical difference between the plurality of new y-axis soft decision values and the plurality of y-axis input values; and
   h. multiplying the plurality of y-axis difference values by a y-axis feedback constant, thereby generating a plurality of y-axis iteration output values, wherein the y-axis feedback constant remains constant for the decoding of the plurality of y-axis input values.

23. The method of iteratively decoding as claimed in claim 22, further comprising the additional steps of:
   a. summing the plurality of y-axis iteration output values with the plurality of x-axis iteration output values and the plurality of initial soft decision values stored in the x-rows and the y-columns, thereby generating a plurality of final output values; and
   b. performing a hard decision operation on the plurality of final output values in order to generate an output codeword having a plurality of bits, wherein each bit is assigned as a binary "1" or a binary "0", and further wherein the assignment of each bit as a binary "1" or the binary "0" is based upon the plurality of final output values.

24. A method of iteratively decoding a received block of data having a plurality of bits represented by a plurality of initial soft decision values, the method comprising the steps of:
   a. storing the plurality of initial soft decision values in a memory having x-rows, y-columns and z-columns;
   b. decoding the plurality of initial soft decision values stored in the x-rows, thereby creating a plurality of new x-axis soft decision values;
   c. generating a plurality of x-axis difference values, wherein said plurality of x-axis difference values represent a numerical difference between the plurality of new x-axis soft decision values and the plurality of initial soft decision values stored in the x-rows;
   d. multiplying the plurality of x-axis difference values by an x-axis feedback constant, thereby generating a plurality of x-axis iteration output values;
   e. summing the plurality of x-axis iteration output values with the plurality of initial soft decision values stored in the y-columns, thereby generating a plurality of y-axis input values;
   f. decoding the plurality of y-axis input values, thereby creating a plurality of new y-axis soft decision values;
   g. generating a plurality of y-axis difference values, wherein said plurality of y-axis difference values represent a numerical difference between the plurality of new y-axis soft decision values and the plurality of y-axis input values;
   h. multiplying the plurality of y-axis difference values by a y-axis feedback constant, thereby generating a plurality of y-axis iteration output values;
   i. summing the plurality of y-axis iteration output values with the plurality of x-axis iteration output values and plurality of initial soft decision values stored in the z-columns, thereby generating a plurality of z-axis input values;

j. decoding the plurality of z-axis input values, thereby creating a plurality of new z-axis soft decision values;

k. generating a plurality of z-axis difference values, wherein said plurality of z-axis difference values represent a numerical difference between the plurality of new z-axis soft decision values and the plurality of z-axis input values; and l. multiplying the plurality of z-axis difference values by a z-axis feedback constant, thereby generating a plurality of z-axis iteration output values.

25. The method of iteratively decoding as claimed in claim 24, which includes the further steps of:

a. summing the plurality of z-axis iteration output values with the plurality of y-axis iteration output values, and the plurality of x-axis iteration output values thereby generating a plurality of final output values; and b. performing a hard decision operation on the plurality of final output values in order to generate an output codeword having a plurality of bits, wherein each bit is assigned as a binary "1" or a binary "0", and further wherein the assignment of each bit as a binary "1" or the binary "0" is based upon the plurality of final output values.

26. The method of iteratively decoding a received block of data as in claim 24, wherein the step of decoding the initial x-axis soft decision values is accomplished by:

a. receiving the plurality of initial x-axis soft decision values and generating an x-axis soft decision vector having a number of x-axis confidence elements and an x-axis hard decision vector having a corresponding number of x-axis hard decision elements, wherein the number of x-axis confidence elements and the corresponding number of x-axis hard decision elements is equal to a total number of x-axis soft decision values in the plurality of soft decision values;

b. comparing the x-axis hard decision elements within the x-axis hard decision vector to each nearest neighbor codeword in a group of nearest neighbor codewords; and c. adjusting the x-axis confidence elements in the x-axis soft decision vector in relation to the results of the comparison.

27. The method of iteratively decoding a received block of data as in claim 26, wherein each nearest neighbor codeword differs from the received block of data by a predetermined number of bits.

28. The method of iteratively decoding a received block of data as in claim 26, wherein the step of comparing the x-axis hard elements within the x-axis hard decision vector includes the further steps of:

a. assigning a difference metric to each nearest neighbor codeword in the group of nearest neighbor codewords based upon the comparison with the x-axis hard decision vector;

b. storing the nearest neighbor codeword having a minimum difference metric;

c. performing an exclusive-or operation between each bit in a center codeword and the corresponding bit in the nearest neighbor codeword with the minimum difference metric, in order to generate a new output codeword;

d. assigning each bit in the new output codeword a soft confidence value based upon a difference between a first difference metric value for the new output codeword as a second difference metric value for the new output codeword with a bit in the mth position inverted; and e. generating a soft difference value for each bit in the new output codeword by calculating a difference between the soft confidence value assigned to each bit in the new output codeword and the soft decision value assigned to each bit in the same bit position within the block being decoded.

29. A method for decoding a linear block encoded string of information bits comprising the steps of:

a. receiving the linear block encoded string of information bits and converting the string into codewords of length N;

b. performing hard and soft decisions on each codeword in order to generate a hard decision vector h of length N and a soft decision vector c of length N, wherein the soft decision vector represents the reliability of the information in the hard decision vector;

c. computing the syndrome of the hard decision vector h;

d. computing the 1 bit parity of the hard decision vector h;

e. if the syndrome calculation indicates that there is an error in the hard decision vector, correcting the error by inverting the appropriate hard decision bit value in the hard decision vector and 2's complementing the soft decision value in the same bit position in the soft decision vector;

f. if the parity was correct and step e. required the hard decision bit value to be inverted, or if the parity was incorrect and step e did not require the hard decision bit value to be inverted, inverting the appropriate hard decision bit value in the hard decision vector and 2's complementing the soft decision value for the last bit position in the soft decision vector;

g. finding the location of the two minimum values in the soft decision vector and designating these locations as LOW1 and LOW2, then replacing the soft decision value at location LOW1 with the 2's complement of the soft decision value at location LOW2 and replacing the soft decision value at location LOW2 with the 2's complement of the soft decision value at location LOW1;

h. finding the sum of the new soft decision values at locations LOW1 and LOW2 in the soft decision vector for later use;

i. computing the set of nearby valid codewords with Hamming weight 4 which have 1's in locations LOW1 and LOW2; for (n, k) codes, this will yield a set of (n/2−1) codewords with each of these nearby valid codewords having a 1 in locations LOW1 and LOW2 and two other locations which are designated Nc1 and Nc2;

j. finding the sum of the soft decision values in locations Nc1 and Nc2 in the soft decision vector;

k. swapping the soft decision value at location Nc1 with the soft decision value at location Nc2 and repeat steps j and k for each of the nearby valid codewords which were computed in step i;

l. from the sums computed in steps h and j, determining which soft decision value sum is the lowest and designate this as Min1;

m. determining which two bit locations created Min1, and designate these two bit locations as MinA and MinB; additionally, determine the next lowest soft value sum from steps i and k, and designate this as Min2;

n. replacing the value at bit location MinA in the soft decision vector with the value of Min2 minus the current value at bit location MinA, and replacing the value at bit location MinB in the soft decision vector with the value of Min2 minus the current value at bit location MinB;

o. subtracting the value of Min1 from the values in all other bit locations in the soft decision vector in order to generate an output codeword—if the locations of Min1 and Min2 are the same as the locations of LOW1 and LOW2 (independent of order), then the output codeword is the center codeword and if the locations Min1 and Min2 are not the same as the locations of LOW1 and LOW2 (independent of order) then invert the hard decision bits in the hard decision vector at locations MinA, MinB, LOW1 and LOW2; and p. for each bit in the output codeword generating a new signed soft value vector, this accomplished by 2's complementing all soft values in the output codeword at bit locations which correspond with bit locations in the hard decision vector having a 0 in their location and creating the new signed soft value vector.

30. The method for decoding a linear block encoded string of information bits as claimed in claim 29, wherein the step of computing the set of nearby valid codewords with Hamming weight 4 which have 1's in locations LOW1 and LOW2 includes the steps of:

a. creating a first used location vector U of length N which initially contains all zeros in each bit position;

b. selecting a first fixed bit position and a second fixed bit position and setting each of these bit positions within the first used location vector U to a binary one; the first used location vector U is then passed into the priority encoder;

c. starting with the bit location $U_0$ and moving toward the bit location $U_N$, searching the first used location vector U for a first zero bit location having a binary 0;

d. generating a second used location vector V of length N, with binary ones in the first fixed bit position, the second fixed bit position and the first zero bit location, and binary zeros in every other bit location;

e. performing a Hamming code syndrome computation on the second used location vector V and computing an error bit location of the Hamming code syndrome computation; and f. generating a nearest neighbor with different bit values from the center codeword in the first fixed bit position, the second fixed bit position, the first zero bit location and the error bit location and the same bit values as the center codeword in all other bit locations.

* * * * *

UNITED STATES PATENT AND TRADEMARK OFFICE
CERTIFICATE OF CORRECTION

PATENT NO. : 6,526,538 B1
DATED : February 25, 2003
INVENTOR(S) : Eric Hewitt

It is certified that error appears in the above-identified patent and that said Letters Patent is hereby corrected as shown below:

Title page,
Item [56], References Cited, OTHER PUBLICATIONS, "A Low Complexity Soft-Output Viterbi Decoder Architecture," reference, please replace "E. Angel" with -- E. Angui --.

Column 2,
Line 44, please replace "is. more" with -- is more --.

Column 4,
Line 64, between the words "of" and "present", please replace "t he" with -- the --.

Column 10,
Line 45, between the words "for" and "groups", please replace "ny" with -- $n_y$ --.

Column 12,
Lines 2-3, between the words "are" and "by" please replace "multiplied." with -- multiplied --.

Column 18,
Line 27, please add -- , -- after the word "explained".

Column 24,
Line 24, please replace "maximum. data" with -- maximum data --.

Signed and Sealed this

First Day of June, 2004

JON W. DUDAS
*Acting Director of the United States Patent and Trademark Office*